US012353240B2

(12) United States Patent
Kasichainula et al.

(10) Patent No.: US 12,353,240 B2
(45) Date of Patent: Jul. 8, 2025

(54) SELECTABLE CLOCK SOURCES

(71) Applicant: Intel Corporation, Santa Clara, CA (US)

(72) Inventors: Kishore Kasichainula, Phoenix, AZ (US); Satheesh Chellappan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 683 days.

(21) Appl. No.: 17/559,679

(22) Filed: Dec. 22, 2021

(65) Prior Publication Data
US 2022/0113758 A1 Apr. 14, 2022

(51) Int. Cl.
G06F 1/14 (2006.01)
H03K 5/00 (2006.01)

(52) U.S. Cl.
CPC ........... *G06F 1/14* (2013.01); *H03K 5/00006* (2013.01)

(58) Field of Classification Search
CPC .... G06F 1/14; G06F 1/10; G06F 1/12; H03K 5/00006
USPC ......................................................... 327/294
See application file for complete search history.

(56) References Cited

U.S. PATENT DOCUMENTS 5,122,677 A * 6/1992 Sato ...................... H04J 3/0688
331/49
6,466,073 B1 * 10/2002 Yukinari ................... H03L 7/16
327/407
7,013,404 B2 * 3/2006 Hanamori ................. G06F 1/08
713/400
7,245,161 B2 * 7/2007 Boerstler ......... G01R 31/31725
327/407
7,446,588 B2 * 11/2008 Boerstler .............. H04L 7/0083
327/99
7,724,059 B2 * 5/2010 Kapur ....................... G06F 1/06
327/299
7,940,830 B2 * 5/2011 Marsili ................ H04B 1/7136
331/46
8,253,449 B2 * 8/2012 Seki .......................... G06F 1/08
327/117
8,896,355 B1 * 11/2014 Lu ............................. H03L 7/16
327/119
8,941,420 B2 * 1/2015 Zerbe ....................... H03L 7/24
327/119
9,275,711 B2 * 3/2016 Oh ........................... G11C 8/10
10,200,020 B2 * 2/2019 Gemma ................ H03K 5/135
10,790,838 B1 * 9/2020 Mosalikanti ............ H03L 7/085
2006/0049887 A1 * 3/2006 Munker .................. H03L 7/099
331/179
2006/0091928 A1 * 5/2006 Kapur ....................... G06F 1/08
327/298

(Continued)

Primary Examiner — Ryan Jager
(74) Attorney, Agent, or Firm — Schwegman Lundberg & Woessner, P.A.

(57) ABSTRACT

System and techniques for selectable clock sources are described herein. An electronic device includes an oscillator for a first clock signal and a tap on an input signal line to a resonator for the oscillator. The tap enables receipt of a second clock signal from an external oscillator. The electronic device includes mode selection circuitry to receives a signal from a tap to an existing input line to the electronic device. The mode selection circuitry uses this signal to select the oscillator output as the clock source or the tap on the input signal line as the clock source.

24 Claims, 12 Drawing Sheets

(56) References Cited

U.S. PATENT DOCUMENTS

| | | | |
|---|---|---|---|
| 2009/0088113 A1* | 4/2009 | Marsili | H04B 1/7136 331/49 |
| 2010/0308874 A1* | 12/2010 | Seki | H03K 23/667 327/115 |
| 2012/0119809 A1* | 5/2012 | Ku | G11C 7/222 327/299 |
| 2017/0214513 A1* | 7/2017 | Asada | H04L 7/0037 |
| 2019/0280695 A1* | 9/2019 | Lindgren | H03L 7/10 |
| 2022/0113758 A1* | 4/2022 | Kasichainula | G06F 1/14 |
| 2022/0263644 A1* | 8/2022 | Liu | H04L 7/0008 |

* cited by examiner

SELECTABLE CLOCK SOURCES

TECHNICAL FIELD

Embodiments described herein generally relate to clock sources within compute devices and more specifically to a selectable clock source.

BACKGROUND

Most compute devices today are designed as synchronous circuits. In this design, an oscillator, called a clock, generates a sequence of repetitive pulses, called the clock signal, that are distributed to the elements of a compute device, synchronizing time steps of operation between these elements. Synchronous logic enables simpler circuit designs to address valid result and race condition issues that may arise across the many devices of modern compute devices. Here, each device (e.g., gate) performs within a time frame (e.g., propagation delay). The interval between clock pulses is long enough to provide devices time to respond to the input changes and also for outputs from these devices to stabilize (e.g., settle) before the next clock pulse occurs. As long as devices are able to accept the inputs and stabilize outputs between the clock pulses, the circuit is guaranteed to be stable and reliable. An asynchronous design (e.g., no common clock signal) adds design complexity to detect when outputs are stable and also to address possible race conditions between devices.

A compute device may clock may be provided by a real-time clock (RTC) component of a system-on-a-chip (SoC). The RTC generally includes a resonator, such as a quartz crystal (xtal), connected to an oscillator via input signal lines. A common arrangement uses a relatively low frequency clock signal of 32 kilohertz (KHz) and a design to enable low-power consumption such that a small battery may power the RTC for many years. When power is first applied to the RTC, it takes some time for the clock signal to stabilize. Generally, the remaining devices of the SoC will not function (e.g., start) until the clock has stabilized. In traditional architectures, a coin cell battery, or other small power source, may be provided to enable the clock to continue running even when mains power is not available. Generally, these clock devices are designed to be power efficient and involve somewhat long (e.g., a second or more) stabilization times as a result.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
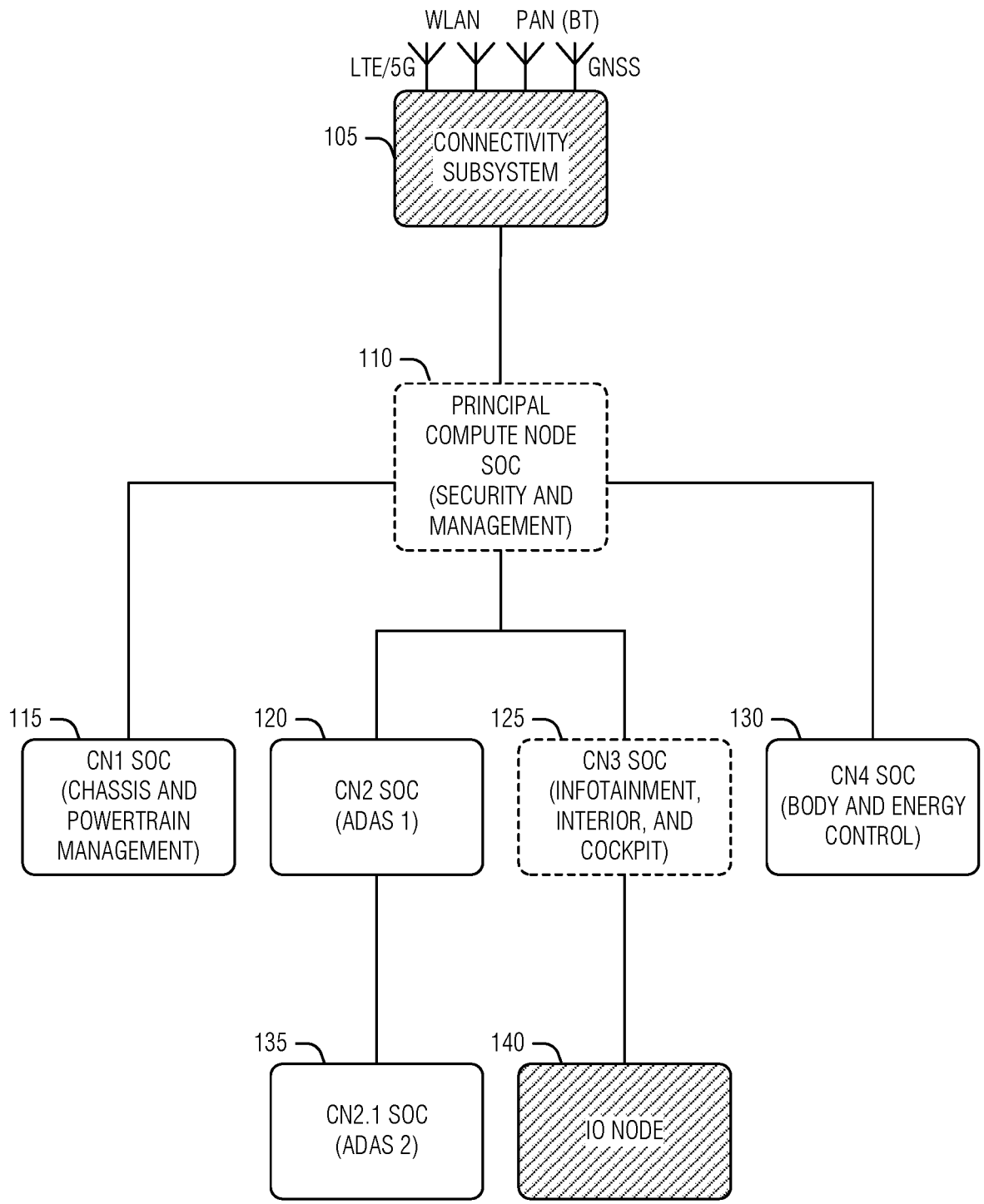
FIG. 1 illustrates an example of an environment including a system with different components having different clock sources, according to an embodiment.

Fast booting, or a fast-boot feature, has become increasingly important today in many Internet-of-Things (IoT) applications, such as automotive application or gateways. With the advent of automotive applications that have hard (e.g., inflexible) requirements for responding to commands from electronic control units (ECUs) over a controller area network (CAN) bus, or the system's ability to immediately feed video to e-mirrors or displays from rear- or surround-view camera systems, some embedded system must boot and begin responding to external events within a very short and predictable timeframe. For example, a telematics control unit may be required to handle a first message within about 100 milliseconds (ms) and respond within 150 ms to the CAN from a cold boot (e.g., when a vehicle is first turned on). An infotainment system may be required to display a "splash" screen within one second of bootup to enable user interaction within two seconds of bootup. Similarly, an ECU with integrated Battery Back-up Unit (BBU) may be required to boot within a 150 ms from the time battery power or mains power is provided (e.g., no coin cell to maintain an always running time (ART) clock) to the time BBU is up. The omission of a battery to enable ART is often the case in applications, such as automotive applications, in which such power sources perform poorly (e.g., unreliably).

Enabling fast-boot for various devices may take several forms. However, these approaches tend to be costly or impart significant impacts in time-to-market. Configurable options using software are generally not possible because real-time-clock circuitry (e.g., a RTC component) is the first element in the boot sequence and gates the entire boot process. In a non-battery supported (e.g., G3) cold boot sequence, the RTC oscillator is generally the largest contributor to high boot times. A typical RTC clock takes between one and two seconds to lock (e.g., stabilize) after power is first application. Such a large phase-locked loop (PLL) lock time is generally unacceptable for time critical applications.

Supporting multiple boot options (e.g., different clock rates) may involve extra input-output (TO) pins to the RTC and change the extremely low leakage (e.g., sub-nano amp) analog circuits that operate at 3.3 volts (V) on special thick oxide devices and boot flow. Adding these extra IO paths to the RTC increases design complexity, increasing costs and time-to-market. One may employ two different PLLs in the RTC component. Here, the first oscillator may work on the 32.768 KHz crystal, which is slow, and the second oscillator may work on higher frequency crystal that locks much faster. There are two disadvantages to this technique. For example, power consumption of RTC component is increased to support both oscillators. This may cause problems because the RTC generally must minimize current draw to enable the battery to last long time. Secondly, extra IO pins are used to provide in additional oscillator signal as well as to indicate which oscillator is being used. Additional IO pins (e.g., bumps) add cost and silicon area to the SoC. Thus, the RTC is customized, requiring design changes that involve additional IO pins.

It may be possible to change the boot flow to bypass the RTC clock completely and use a different clock source that runs on the $V_{NN}$ supply. Disadvantages to this approach may include considerable boot flow changes. In current boot flows, the RTC 3.3V rail typical comes first and then the VNN. Hence, the RTC still restricts the entire boot flow.

Another technique may include feeding an auxiliary 3.3V supply to the RTC. An issue here is in identifying such an "always-on" auxiliary supply. This technique generally does not work for applications that are not powered by battery. Having a coin-cell in some applications is either too expensive or the coin-cell itself may not work in such operating conditions or may be too inconvenient for the customers to swap the coin-cell especially in closed-box applications.

It may be possible to provide a 32.768 KHz clock signal directly into the SoC by over-driving the RTC oscillator. Again, this technique relies on an "always-on" power supply for the external clock source.

To address the ability to add fast boot to an RTC while minimizing IO pin complexity, a second (e.g., fast) oscillator may be added to a system. The second oscillator may provide a clock signal to the RTC via an existing resonator signal input line to the RTC. A signal may be given to the RTC as to whether the resonator or the second oscillator is providing the signal by manipulating existing signal lines into the RTC, such as a source reset and a test line. Circuitry within the RTC may detect this signal and select which source clock signal to use. Because the second clock may have a different operating frequency than the first clock native to the RTC, the circuitry includes a normalizer to multiply or divide the second clock signal to match the frequency of the first clock. Thus, subsequent components may operate without regard to which clock source is being used by the RTC.

This technique is a more elegant (e.g., simpler and cheaper) mechanism to implement fast-boot in a device. For example, an external 4.096 MHz oscillator—which runs on the RTC 3.3V supply—may be used along with a few modifications to the RTC to achieve fast-boot. The typical lock time for such a 4 MHz oscillator is less than fifteen ms, which is well within the hard boot time requirements of automotive or gateway applications. A phase detection mechanism is employed to use already existing external RTC circuitry (e.g., IO pins) for signaling whether the boot is from a four MHz or a 32.768 KHz oscillator. This eliminates the need for additional SoC pins or changes to the boot flow.

In an example, the type of clock source may be fed into the BRTCX1 IO pad by leveraging phase relationship between two signals. In an example, t32a and t32b counters may be trimmed for the faster clock source to twenty ms to reduce overall boot time. Using the four MHz clock source thus reduces the lock time and hence overall boot time. Because no additional IO pins or power-supplies or boot flow changes are needed, this technique may enable autonomous switching from fast boot to RTC after G3 exit to S0 system states. Because no additional IO pins or power-supplies or changes to the boot flow are needed, there is no impact to power dissipation as fewer gates are used to implement the design. By reducing the lock time from one second to less than fifty ms, the technique enables existing devices to be used in time-critical application, such as in IoT devices mentioned above or in non-IoT domains, such as wearable devices or medical devices. In medical devices fast boot is key for patient care and user experience. Additional details and examples are provided below.

FIG. 1 illustrates an example of an environment including a system with different components having different clock sources, according to an embodiment. The illustrated system is of an automotive platform. As illustrated, the shaded components are IO components, such as the connectivity subsystem 105 and the IO node 140. The components with dashed lines are configured for fast-boot, such as the principal compute node 110 and the compute node (CN) 3 SoC 125, providing infotainment and cockpit interior functionality. The remaining components—such as the CN1 SoC 115, the CN2 SoC 120, the CN2.1 SoC 135, the CN4 SOC 130, the connectivity subsystem 105, and the IO node 140—may be configured for the more power efficient slow-boot.

The illustrated elements may be considered a typical cluster of CN SoC's involved in an automotive system and is used to illustrate an example application to achieve fast boot. An advanced driver assistance system (ADAS) generally defines the level of autonomous driver assistance required in the platform. An independent infotainment SoC, such as the CN3 125 and the principal CN 110, may require fast-boot for the best user experience. From "key-ON" there is sub-second latency expected to boot the panel and activate the dashboard. Other SoCs, such as the connectivity subsystem 105, the CN2.x (e.g., CN2 120 or CN 2.1 135) for ADAS, or other vehicle management SoC may boot in parallel, avoiding such strict latency requirements.

As noted above, in a typical client or IoT systems, one of the biggest contributors to high boot time is the RTC. When an ECU is cold booted from G3 without battery support of the clock oscillator, the RTC 3.3V rail ramps up from de-assertion state and the RTC clocks start oscillating. It takes a relatively long time (e.g., a second or more) for the clocks to stabilize and lock. There are two reasons for such a high lock time. First, traditionally the RTC logic is built on thick, very low leakage, gate cells to draw extremely low current (e.g., sub nano amperes). This design originally met personal computer (PC) use conditions that run on a coin cell battery where the coin cell must last for several years. Such an extremely low current oscillator takes a long time for oscillations to become stronger which leads to long lock time. Though this stringent requirement help satisfy PC use conditions, it poses a severe limitation on other applications, such as automotive applications or gateways, where G3 power (e.g., mechanically off) is the starting point and application boot time is expected to be less than few hundred milliseconds. Second, the lower the clock frequency, the higher the lock time. Hence, at 32.768 KHz clock takes a long time to lock.

Figure 2:
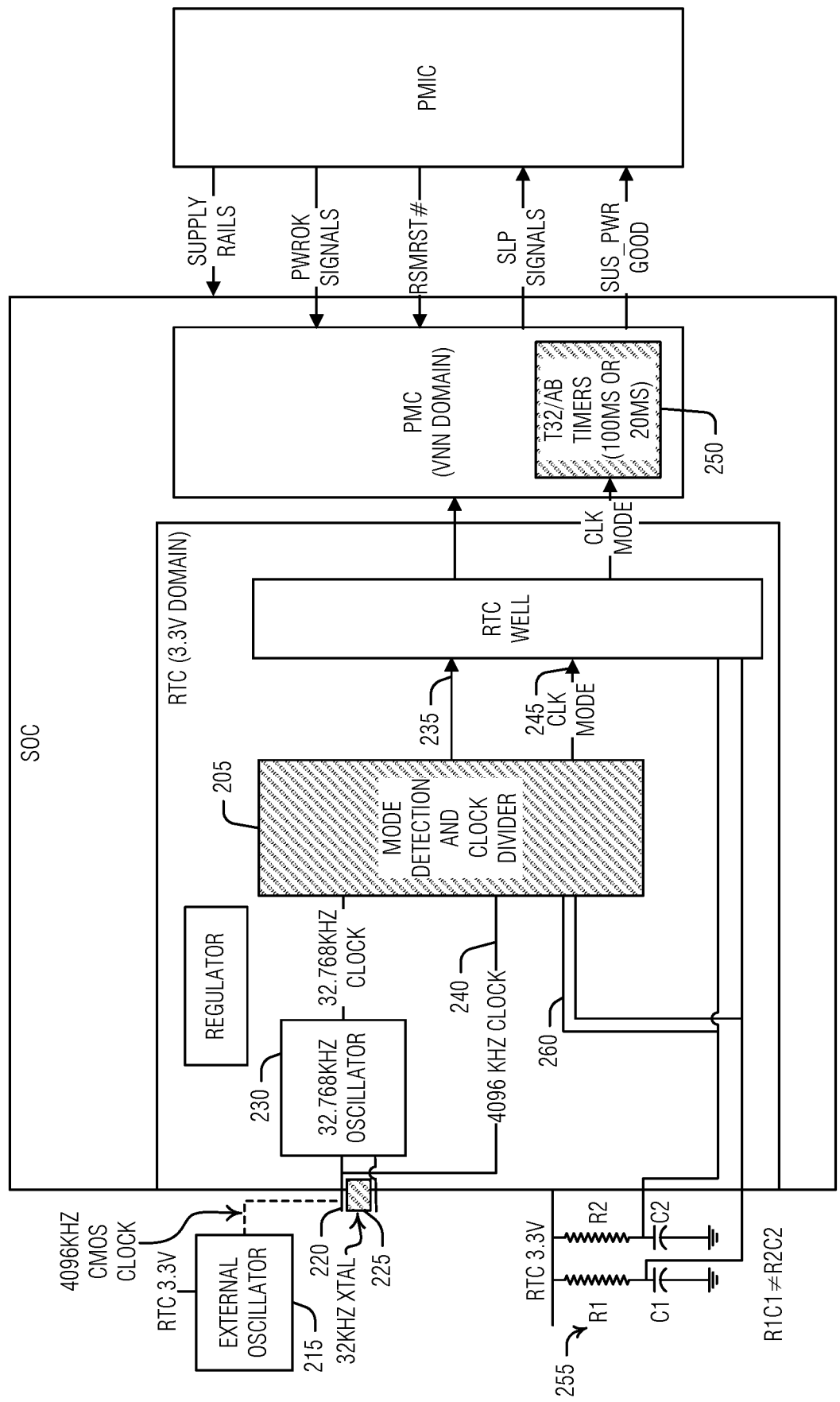
FIG. 2 an example of an RTC arrangement with selectable clock sources, according to an embodiment.

FIG. 2 an example of an RTC arrangement with selectable clock sources, according to an embodiment. The illustrated arrangement has an external four MHz clock source 215 that is connected to the BRTCX1 IO pad (e.g., input signal line 220) instead of a regular 32.768 KHz crystal resonator 225. Within the RTC and power management component (PMC) blocks, the mode detection and clock divider circuitry 205 and variable timer circuitry 250 are respectively added to sense the external clock source and divide the high frequency clock signal by a divide-by-125 clock divider (for the four MHz oscillator 215) to generate a precise 32.768 KHz clock signal. The t32a timer, which is generally ninety-five ms, is modified to count fifteen ms and similarly t32b timer, which is twenty ms, is modified to count five ms. The sum of t32a t32b timers are set to twenty ms because the lock time for four MHz clock is much less than twenty ms.

To detect whether the clock source is slow (e.g., 32.768 KHz from the oscillator 230) or fast (e.g., from the four MHz oscillator 215) the existing RTEST and SRTCRST signals 255 are decoded—via taps 260 to the mode detection circuitry 205—using temporal phase shift without changing their original functionalities. The values of existing RTEST and SRTCRST signals 255 are modified to whether one (e.g., the RTEST signal) is high or low when the other signal first comes high after the boot. This may be controlled via the resistor and capacitor values selected for one of the signals. Thus, for example, a first R2 and C2 combination is elected for the 32.768 KHz oscillator 230 and a second R2 and C2 combination is used for the external oscillator 215. Within the mode detection circuitry 205, this phase shift of RTEST is latched on the rising edge of SRTCRST. This latched value is then used to choose correct clock source. When the external oscillator 215 is selected, the mode detection circuitry 205 bypasses the internal oscillator 230, instead accepting the clock signal from the tap 240 or the resonator input signal line 220. The mode detection circuitry 205 also enables a clock divider or multiplier within the RTC to normalize the external oscillator 215 clock signal to match that of the internal oscillator 230. Further, the clock mode line 245 provides selection of the clock source to enable the timer circuitry 250 of the PMC to adjust based on the expected locking times of the given oscillator.

The following rephrases the above to provide a more linear operations of the components. For example, the mode detection circuitry 205 is configured to detect a first signal. In an example, the first signal is a state of a reset line into the RTC (e.g., SRTCRST).

Figure 3:
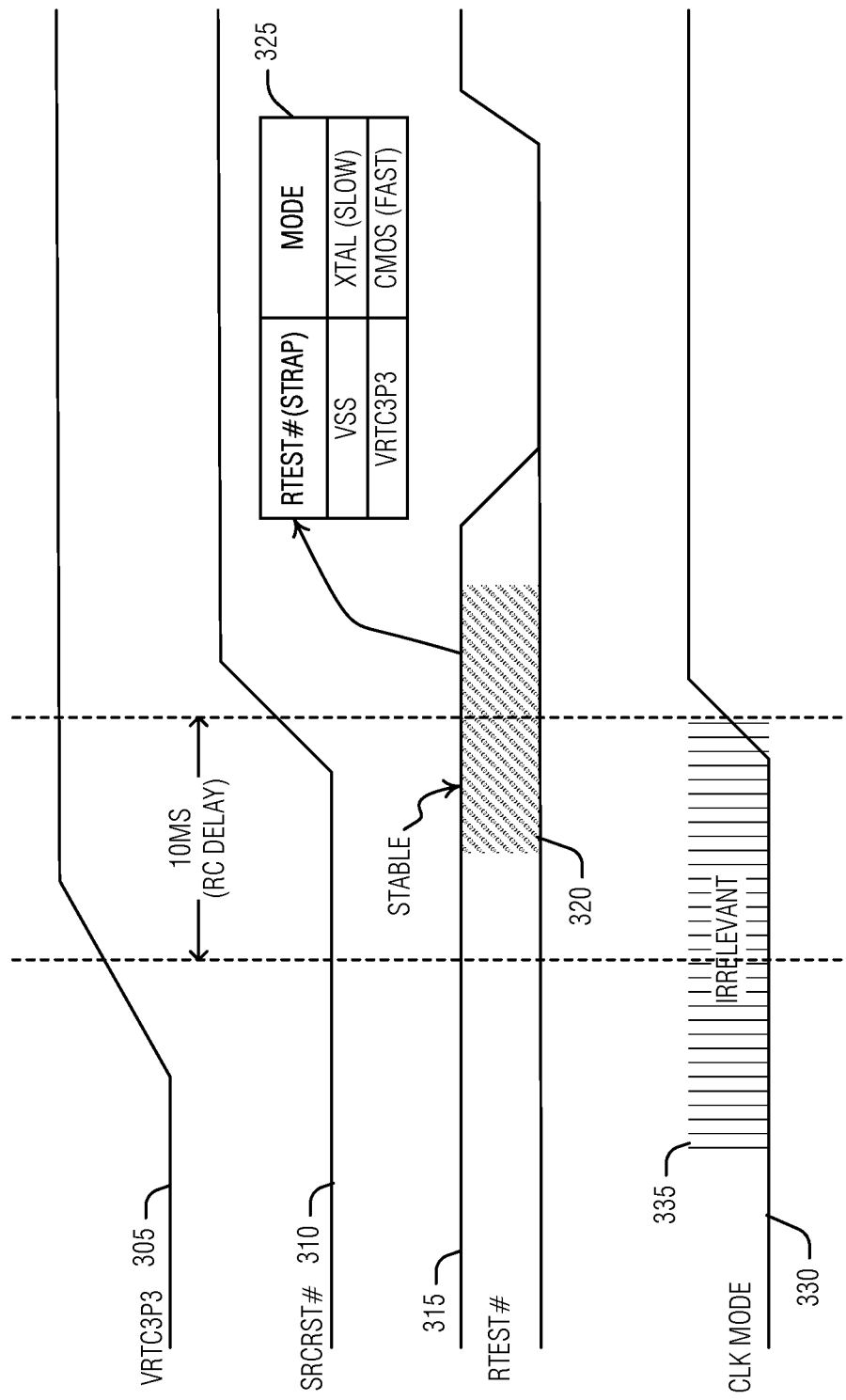
FIG. 3 illustrates an example of a timing diagram to signal speed of the clock source, according to an embodiment.

The mode detection circuitry 205 is configured to, in response to detecting the first signal, detect a second signal is measured to detect a discrete position of the second signal. Here, the discrete position is one of multiple possible discrete positions of the second signal. Each of these multiple discrete positions correspond to different clock speed. As illustrated in FIG. 3, the discrete position is one of two, either being high or low when the first signal is detected. However, in other designs, more discrete signals may be possible. In each case, the discrete position operates as a symbol as to which clock signal speed is being used in the device. Here, clock speed may represent a frequency directly, such as 32.768 KHz or four MHz as illustrated, or as a relative speed (e.g., slow, fast, etc.). In the latter case, the relative speed is reduced to a concrete frequency in the clo0ck divider or in the timer circuitry 250.

In an example, the second signal is a state of a test line into the RTC (e.g., RTEST). In an example, resistance or capacitance on the test line is configured to select which of the multiple discrete positions is the discrete position.

In an example, a first line of the multiple lines to the mode detection device originates from an oscillator included in the RTC (e.g., the oscillator 230). In an example, the oscillator 230 operates at a frequency of 32.768 kilohertz when the resonator 225 is present.

In an example, a second line of the multiple lines to the mode detection device is a tap 240 of an input signal line 220 to the resonator 225 for the oscillator 230. In an example, the mode detection circuitry 205 is configured to receive the clock signal at the input signal line 220 from the second oscillator 215 external to the RTC. In an example, the clock signal of the external oscillator 215 has a frequency of four megahertz. In an example, the resonator 225 is absent when the external oscillator 215 is used. Here, the RTC remains unchanged when the external oscillator 215 is used for fast boot, but the overall arrangement is static. That is, this RTC will also be fast-boot.

The mode detection circuitry 205 is configured to select the input line of multiple input lines based on the discrete position of the second signal. This input line carries a clock signal of a clock frequency corresponding to the clock speed indicated by the discrete position of the second signal. In this manner, the mode detection circuitry 205 selects, or bypasses, a clock signal from either the internal oscillator 230 or the external oscillator 215.

The mode detection circuitry 205 is configured to normalize the clock signal to a normalized clock signal. If the clock signal is provided by the internal oscillator 230, then normalizing the clock signal does not involve further operations because the subsequent system components expect such a clock signal. However, when using the external oscillator 215, generally the clock signal will be divided (e.g., by 125 for the four MHz and 32.768 KHz clock signals illustrated) to arrive at the normalized clock signal.

Once the normalized clock signal is achieved, it is provided to other system components, such as the PMC. In an example, the mode detection circuitry 205 is configured to also output a clock mode signal 245. Here, the clock mode signal indicates the clock speed corresponding to the discrete position of the second signal above. In an example, the mode detection circuitry 205 outputs the clock mode signal 245 to the PMC. In an example, the PMC includes timer circuitry 250 that selects a clock count based on the clock mode signal. In an example, the clock count is a clock tick threshold before starting other components of a device that includes the PMC. Generally, the timer circuitry 250 operates by counting clock ticks until a threshold is reached. The threshold is set to provide enough time for the clock source to stabilize. When the slower clock source is used, a higher threshold is used. Thus, the clock mode signal 245 is used by the timer circuitry 250 to select the threshold counts before initiating downstream (e.g., power management integrated circuit (PMIC)) devices.

FIG. 3 illustrates an example of a timing diagram to signal speed of the clock source, according to an embodiment. As shown, the SRTCRST signal is released about ten ms after the VRTC3P3 rail is stable. This is done by choosing appropriate resistor-capacitor (RC) values. The RTEST assertion is varied according to the clock source being used. Thus, if the internal oscillator (e.g., slow clock source) is used, then the RTEST may be asserted few milliseconds after assertion of SRTCRST. Similarly, the external oscillator (e.g., fast clock source) is used, then the RTEST may be asserted few milliseconds prior to the assertion of SRTCRST. In an example, within the mode detection circuitry, this phase shift of RTEST is latched on the rising edge of SRTCRST. This latched value may then be used for choosing the clock source.

Figure 4:
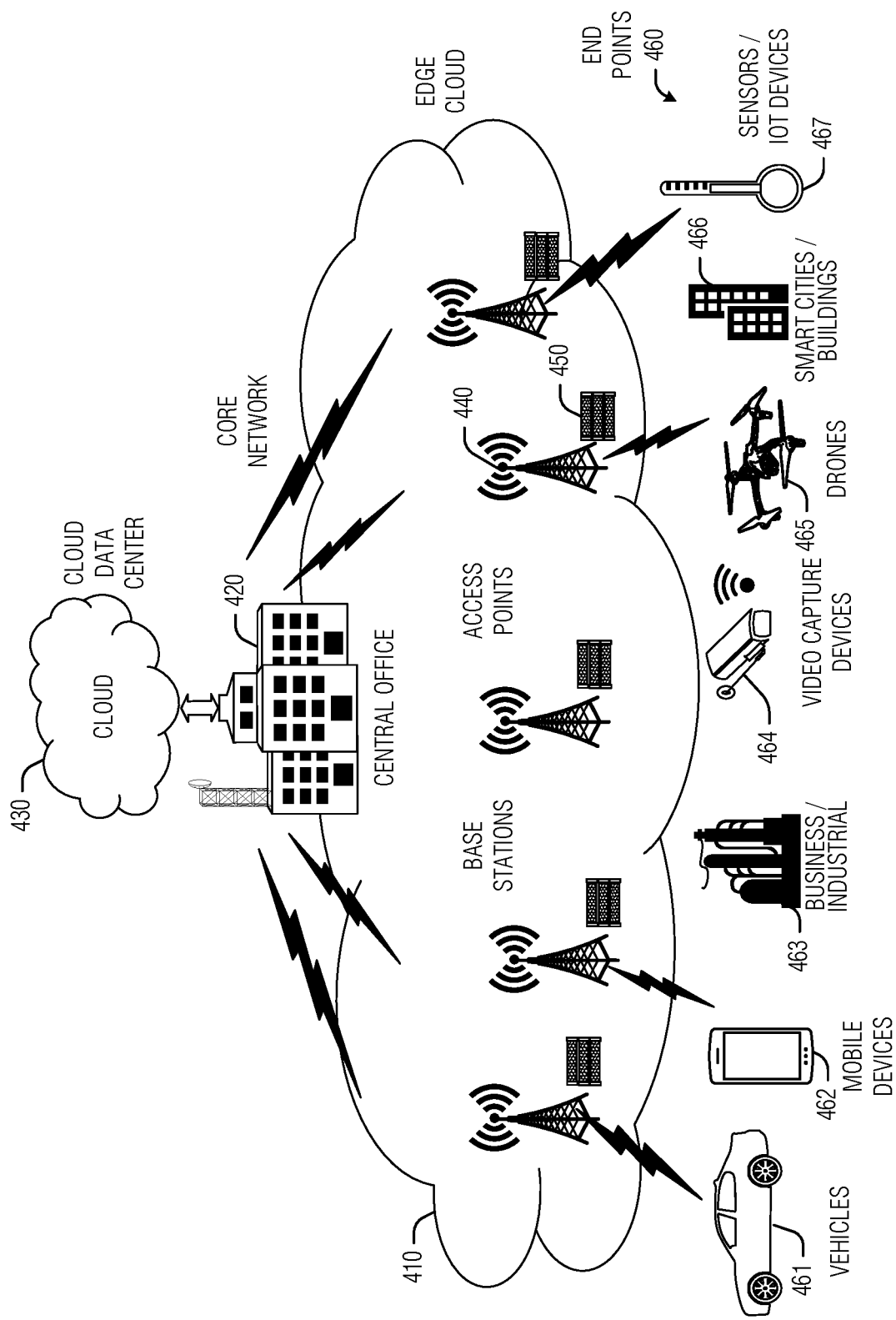
FIG. 4 illustrates an overview of an Edge cloud configuration for Edge computing.

FIG. 4 is a block diagram 400 showing an overview of a configuration for Edge computing, which includes a layer of processing referred to in many of the following examples as an "Edge cloud". As shown, the Edge cloud 410 is co-located at an Edge location, such as an access point or base station 440, a local processing hub 450, or a central office 420, and thus may include multiple entities, devices, and equipment instances. The Edge cloud 410 is located much closer to the endpoint (consumer and producer) data sources 460 (e.g., autonomous vehicles 461, user equipment 462, business and industrial equipment 463, video capture devices 464, drones 465, smart cities and building devices 466, sensors and IoT devices 467, etc.) than the cloud data center 430. Compute, memory, and storage resources which are offered at the edges in the Edge cloud 410 are critical to providing ultra-low latency response times for services and functions used by the endpoint data sources 460 as well as reduce network backhaul traffic from the Edge cloud 410 toward cloud data center 430 thus improving energy consumption and overall network usages among other benefits.

Compute, memory, and storage are scarce resources, and generally decrease depending on the Edge location (e.g., fewer processing resources being available at consumer endpoint devices, than at a base station, than at a central office). However, the closer that the Edge location is to the endpoint (e.g., user equipment (UE)), the more that space and power is often constrained. Thus, Edge computing attempts to reduce the amount of resources needed for network services, through the distribution of more resources which are located closer both geographically and in network access time. In this manner, Edge computing attempts to bring the compute resources to the workload data where appropriate, or, bring the workload data to the compute resources.

The following describes aspects of an Edge cloud architecture that covers multiple potential deployments and addresses restrictions that some network operators or service providers may have in their own infrastructures. These include, variation of configurations based on the Edge location (because edges at a base station level, for instance, may have more constrained performance and capabilities in a multi-tenant scenario); configurations based on the type of compute, memory, storage, fabric, acceleration, or like resources available to Edge locations, tiers of locations, or groups of locations; the service, security, and management and orchestration capabilities; and related objectives to achieve usability and performance of end services. These deployments may accomplish processing in network layers that may be considered as "near Edge", "close Edge", "local Edge", "middle Edge", or "far Edge" layers, depending on latency, distance, and timing characteristics.

Edge computing is a developing paradigm where computing is performed at or closer to the "Edge" of a network, typically through the use of a compute platform (e.g., x86 or ARM compute hardware architecture) implemented at base stations, gateways, network routers, or other devices which are much closer to endpoint devices producing and consuming the data. For example, Edge gateway servers may be equipped with pools of memory and storage resources to perform computation in real-time for low latency use-cases (e.g., autonomous driving or video surveillance) for connected client devices. Or as an example, base stations may be augmented with compute and acceleration resources to directly process service workloads for connected user equipment, without further communicating data via backhaul networks. Or as another example, central office network management hardware may be replaced with standardized compute hardware that performs virtualized network functions and offers compute resources for the execution of services and consumer functions for connected devices. Within Edge computing networks, there may be scenarios in services which the compute resource will be "moved" to the data, as well as scenarios in which the data will be "moved" to the compute resource. Or as an example, base station compute, acceleration and network resources can provide services in order to scale to workload demands on an as needed basis by activating dormant capacity (subscription, capacity on demand) in order to manage corner cases, emergencies or to provide longevity for deployed resources over a significantly longer implemented lifecycle.

Figure 5:
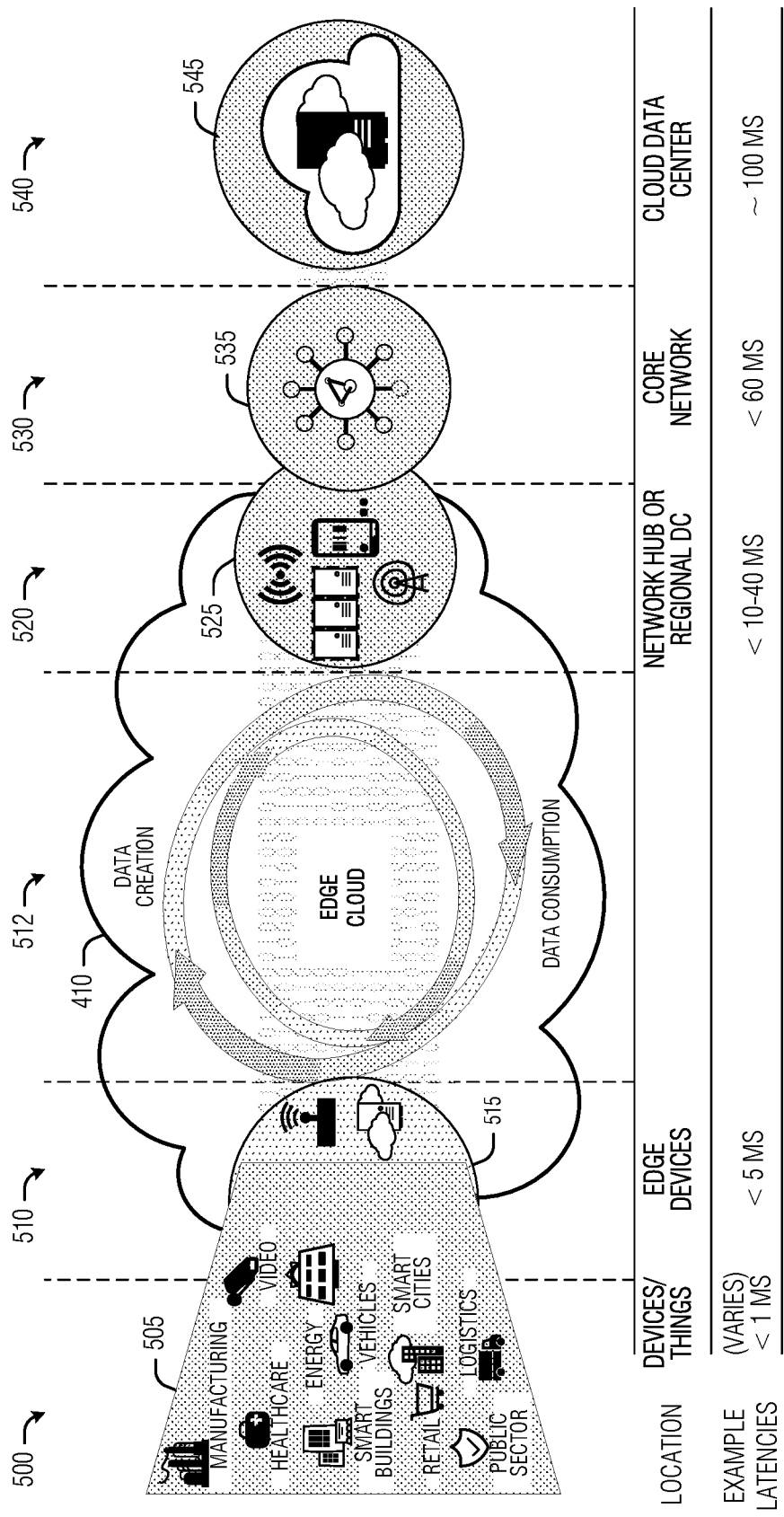
FIG. 5 illustrates operational layers among endpoints, an Edge cloud, and cloud computing environments.

FIG. 5 illustrates operational layers among endpoints, an Edge cloud, and cloud computing environments. Specifically, FIG. 5 depicts examples of computational use cases 505, utilizing the Edge cloud 410 among multiple illustrative layers of network computing. The layers begin at an endpoint (devices and things) layer 500, which accesses the Edge cloud 410 to conduct data creation, analysis, and data consumption activities. The Edge cloud 410 may span multiple network layers, such as an Edge devices layer 510 having gateways, on-premise servers, or network equipment (nodes 515) located in physically proximate Edge systems; a network access layer 520, encompassing base stations, radio processing units, network hubs, regional data centers (DC), or local network equipment (equipment 525); and any equipment, devices, or nodes located therebetween (in layer 512, not illustrated in detail). The network communications within the Edge cloud 410 and among the various layers may occur via any number of wired or wireless mediums, including via connectivity architectures and technologies not depicted.

Examples of latency, resulting from network communication distance and processing time constraints, may range from less than a millisecond (ms) when among the endpoint layer 500, under 5 ms at the Edge devices layer 510, to even between 10 to 40 ms when communicating with nodes at the network access layer 520. Beyond the Edge cloud 410 are core network 530 and cloud data center 540 layers, each with increasing latency (e.g., between 50-60 ms at the core network layer 530, to 100 or more ms at the cloud data center layer). As a result, operations at a core network data center 535 or a cloud data center 545, with latencies of at least 50 to 100 ms or more, will not be able to accomplish many time-critical functions of the use cases 505. Each of these latency values are provided for purposes of illustration and contrast; it will be understood that the use of other access network mediums and technologies may further reduce the latencies. In some examples, respective portions of the network may be categorized as "close Edge", "local Edge", "near Edge", "middle Edge", or "far Edge" layers, relative to a network source and destination. For instance, from the perspective of the core network data center 535 or a cloud data center 545, a central office or content data network may be considered as being located within a "near Edge" layer ("near" to the cloud, having high latency values when communicating with the devices and endpoints of the use cases 505), whereas an access point, base station, on-premise server, or network gateway may be considered as located within a "far Edge" layer ("far" from the cloud, having low latency values when communicating with the devices and endpoints of the use cases 505). It will be understood that other categorizations of a particular network layer as constituting a "close", "local", "near", "middle", or "far" Edge may be based on latency, distance, number of network hops, or other measurable characteristics, as measured from a source in any of the network layers 500-540.

The various use cases 505 may access resources under usage pressure from incoming streams, due to multiple services utilizing the Edge cloud. To achieve results with low latency, the services executed within the Edge cloud 410 balance varying requirements in terms of: (a) Priority (throughput or latency) and Quality of Service (QoS) (e.g., traffic for an autonomous car may have higher priority than a temperature sensor in terms of response time requirement; or, a performance sensitivity/bottleneck may exist at a compute/accelerator, memory, storage, or network resource, depending on the application); (b) Reliability and Resiliency (e.g., some input streams need to be acted upon and the traffic routed with mission-critical reliability, where as some other input streams may be tolerate an occasional failure, depending on the application); and (c) Physical constraints (e.g., power, cooling and form-factor, etc.).

The end-to-end service view for these use cases involves the concept of a service-flow and is associated with a transaction. The transaction details the overall service requirement for the entity consuming the service, as well as the associated services for the resources, workloads, workflows, and business functional and business level requirements. The services executed with the "terms" described may be managed at each layer in a way to assure real time, and runtime contractual compliance for the transaction during the lifecycle of the service. When a component in the transaction is missing its agreed to Service Level Agreement (SLA), the system as a whole (components in the transaction) may provide the ability to (1) understand the impact of the SLA violation, and (2) augment other components in the system to resume overall transaction SLA, and (3) implement steps to remediate.

Thus, with these variations and service features in mind, Edge computing within the Edge cloud 410 may provide the ability to serve and respond to multiple applications of the use cases 505 (e.g., object tracking, video surveillance, connected cars, etc.) in real-time or near real-time, and meet ultra-low latency requirements for these multiple applications. These advantages enable a whole new class of applications (e.g., Virtual Network Functions (VNFs), Function as a Service (FaaS), Edge as a Service (EaaS), standard processes, etc.), which cannot leverage conventional cloud computing due to latency or other limitations.

However, with the advantages of Edge computing comes the following caveats. The devices located at the Edge are often resource constrained and therefore there is pressure on usage of Edge resources. Typically, this is addressed through the pooling of memory and storage resources for use by multiple users (tenants) and devices. The Edge may be power and cooling constrained and therefore the power usage needs to be accounted for by the applications that are consuming the most power. There may be inherent power-performance tradeoffs in these pooled memory resources, as many of them are likely to use emerging memory technologies, where more power requires greater memory bandwidth. Likewise, improved security of hardware and root of trust trusted functions are also required, because Edge locations may be unmanned and may even need permissioned access (e.g., when housed in a third-party location). Such issues are magnified in the Edge cloud 410 in a multi-tenant, multi-owner, or multi-access setting, where services and applications are requested by many users, especially as network usage dynamically fluctuates and the composition of the multiple stakeholders, use cases, and services changes.

At a more generic level, an Edge computing system may be described to encompass any number of deployments at the previously discussed layers operating in the Edge cloud 410 (network layers 500-540), which provide coordination from client and distributed compute devices. One or more Edge gateway nodes, one or more Edge aggregation nodes, and one or more core data centers may be distributed across layers of the network to provide an implementation of the Edge computing system by or on behalf of a telecommunication service provider ("telco", or "TSP"), internet-of-things service provider, cloud service provider (CSP), enterprise entity, or any other number of entities. Various implementations and configurations of the Edge computing system may be provided dynamically, such as when orchestrated to meet service objectives.

Consistent with the examples provided herein, a client compute node may be embodied as any type of endpoint component, device, appliance, or other thing capable of communicating as a producer or consumer of data. Further, the label "node" or "device" as used in the Edge computing system does not necessarily mean that such node or device operates in a client or agent/minion/follower role; rather, any of the nodes or devices in the Edge computing system refer to individual entities, nodes, or subsystems which include discrete or connected hardware or software configurations to facilitate or use the Edge cloud 410.

As such, the Edge cloud 410 is formed from network components and functional features operated by and within Edge gateway nodes, Edge aggregation nodes, or other Edge compute nodes among network layers 510-530. The Edge cloud 410 thus may be embodied as any type of network that provides Edge computing or storage resources which are proximately located to radio access network (RAN) capable endpoint devices (e.g., mobile compute devices, IoT devices, smart devices, etc.), which are discussed herein. In other words, the Edge cloud 410 may be envisioned as an "Edge" which connects the endpoint devices and traditional network access points that serve as an ingress point into service provider core networks, including mobile carrier networks (e.g., Global System for Mobile Communications (GSM) networks, Long-Term Evolution (LTE) networks, 5G/6G networks, etc.), while also providing storage or compute capabilities. Other types and forms of network access (e.g., Wi-Fi, long-range wireless, wired networks including optical networks, etc.) may also be utilized in place of or in combination with such 3GPP carrier networks.

The network components of the Edge cloud 410 may be servers, multi-tenant servers, appliance compute devices, or any other type of compute devices. For example, the Edge cloud 410 may include an appliance compute device that is a self-contained electronic device including a housing, a chassis, a case, or a shell. In some circumstances, the housing may be dimensioned for portability such that it can be carried by a human or shipped. Example housings may include materials that form one or more exterior surfaces that partially or fully protect contents of the appliance, in which protection may include weather protection, hazardous environment protection (e.g., electromagnetic interference (EMI), vibration, extreme temperatures, etc.), or enable submergibility. Example housings may include power circuitry to provide power for stationary or portable implementations, such as alternating current (AC) power inputs, direct current (DC) power inputs, AC/DC converter(s), DC/AC converter(s), DC/DC converter(s), power regulators, transformers, charging circuitry, batteries, wired inputs, or wireless power inputs. Example housings or surfaces thereof may include or connect to mounting hardware to enable attachment to structures such as buildings, telecommunication structures (e.g., poles, antenna structures, etc.), or racks (e.g., server racks, blade mounts, etc.). Example housings or surfaces thereof may support one or more sensors (e.g., temperature sensors, vibration sensors, light sensors, acoustic sensors, capacitive sensors, proximity sensors, infrared or other visual thermal sensors, etc.). One or more such sensors may be contained in, carried by, or otherwise embedded in the surface or mounted to the surface of the appliance. Example housings or surfaces thereof may support mechanical connectivity, such as propulsion hardware (e.g., wheels, rotors such as propellers, etc.) or articulating hardware (e.g., robot arms, pivotable appendages, etc.). In some circumstances, the sensors may include any type of input devices such as user interface hardware (e.g., buttons, switches, dials, sliders, microphones, etc.). In some circumstances, example housings include output devices contained in, carried by, embedded therein or attached thereto. Output devices may include displays, touchscreens, lights, light-emitting diodes (LEDs), speakers, input/output (I/O) ports (e.g., universal serial bus (USB)), etc. In some circumstances, Edge devices are devices presented in the network for a specific purpose (e.g., a traffic light), but may have processing or other capacities that may be utilized for other purposes. Such Edge devices may be independent from other networked devices and may be provided with a housing having a form factor suitable for its primary purpose; yet be available for other compute tasks that do not interfere with its primary task. Edge devices include Internet of Things devices. The appliance compute device may include hardware and software components to manage local issues such as device temperature, vibration, resource utilization, updates, power issues, physical and network security, etc. Example hardware for implementing an appliance compute device is described in conjunction with FIG. 7B. The Edge cloud 410 may also include one or more servers or one or more multi-tenant servers. Such a server may include an operating system and implement a virtual computing environment. A virtual computing environment may include a hypervisor managing (e.g., spawning, deploying, commissioning, destroying, decommissioning, etc.) one or more virtual machines, one or more containers, etc. Such virtual computing environments provide an execution environment in which one or more applications or other software, code, or scripts may execute while being isolated from one or more other applications, software, code, or scripts.

Figure 6:
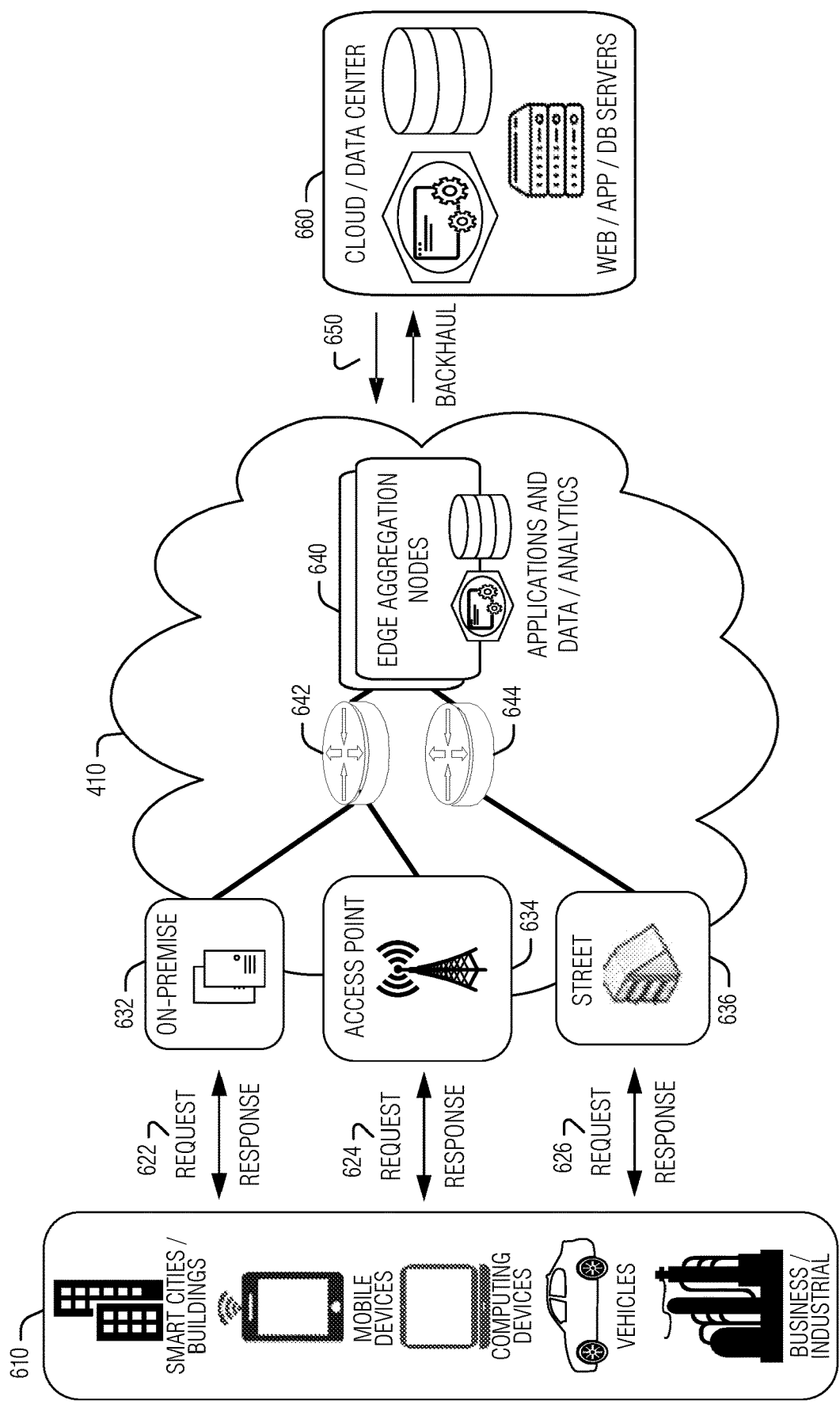
FIG. 6 illustrates an example approach for networking and services in an Edge computing system.

In FIG. 6, various client endpoints 610 (in the form of mobile devices, computers, autonomous vehicles, business computing equipment, industrial processing equipment) exchange requests and responses that are specific to the type of endpoint network aggregation. For instance, client endpoints 610 may obtain network access via a wired broadband network, by exchanging requests and responses 622 through an on-premise network system 632. Some client endpoints 610, such as mobile compute devices, may obtain network access via a wireless broadband network, by exchanging requests and responses 624 through an access point (e.g., a cellular network tower) 634. Some client endpoints 610, such as autonomous vehicles may obtain network access for requests and responses 626 via a wireless vehicular network through a street-located network system 636. However, regardless of the type of network access, the TSP may deploy aggregation points 642, 644 within the Edge cloud 410 to aggregate traffic and requests. Thus, within the Edge cloud 410, the TSP may deploy various compute and storage resources, such as at Edge aggregation nodes 640, to provide requested content. The Edge aggregation nodes 640 and other systems of the Edge cloud 410 are connected to a cloud or data center 660, which uses a backhaul network 650 to fulfill higher-latency requests from a cloud/data center for websites, applications, database servers, etc. Additional or consolidated instances of the Edge aggregation nodes 640 and the aggregation points 642, 644, including those deployed on a single server framework, may also be present within the Edge cloud 410 or other areas of the TSP infrastructure.

In further examples, any of the compute nodes or devices discussed with reference to the present Edge computing systems and environment may be fulfilled based on the components depicted in FIGS. 7A and 7B. Respective Edge compute nodes may be embodied as a type of device, appliance, computer, or other "thing" capable of communicating with other Edge, networking, or endpoint components. For example, an Edge compute device may be embodied as a personal computer, server, smartphone, a mobile compute device, a smart appliance, an in-vehicle compute system (e.g., a navigation system), a self-contained device having an outer case, shell, etc., or other device or system capable of performing the described functions.

Figure 7A:
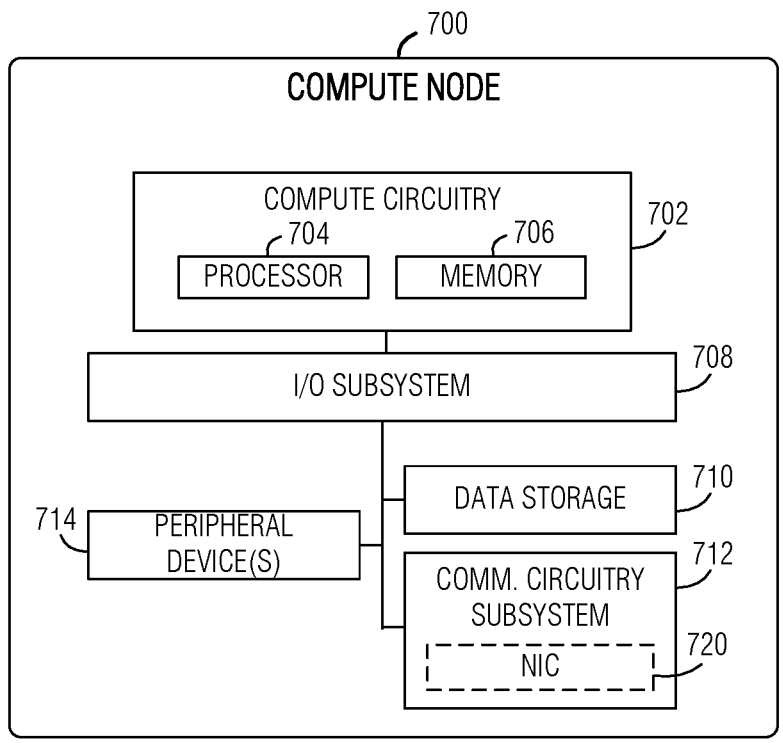
FIG. 7A provides an overview of example components for compute deployed at a compute node in an Edge computing system.

In the simplified example depicted in FIG. 7A, an Edge compute node 700 includes a compute engine (also referred to herein as "compute circuitry") 702, an input/output (I/O) subsystem (also referred to herein as "I/O circuitry") 708, data storage (also referred to herein as "data storage circuitry") 710, a communication circuitry subsystem 712, and, optionally, one or more peripheral devices (also referred to herein as "peripheral device circuitry") 714. In other examples, respective compute devices may include other or additional components, such as those typically found in a computer (e.g., a display, peripheral devices, etc.). Additionally, in some examples, one or more of the illustrative components may be incorporated in, or otherwise form a portion of, another component.

The compute node 700 may be embodied as any type of engine, device, or collection of devices capable of performing various compute functions. In some examples, the compute node 700 may be embodied as a single device such as an integrated circuit, an embedded system, a field-programmable gate array (FPGA), a system-on-a-chip (SOC), or other integrated system or device. In the illustrative example, the compute node 700 includes or is embodied as a processor (also referred to herein as "processor circuitry") 704 and a memory (also referred to herein as "memory circuitry") 706. The processor 704 may be embodied as any type of processor(s) capable of performing the functions described herein (e.g., executing an application). For example, the processor 704 may be embodied as a multi-core processor(s), a microcontroller, a processing unit, a specialized or special purpose processing unit, or other processor or processing/controlling circuit.

In some examples, the processor 704 may be embodied as, include, or be coupled to an FPGA, an application specific integrated circuit (ASIC), reconfigurable hardware or hardware circuitry, or other specialized hardware to facilitate performance of the functions described herein. Also in some examples, the processor 704 may be embodied as a specialized x-processing unit (xPU) also known as a data processing unit (DPU), infrastructure processing unit (IPU), or network processing unit (NPU). Such an xPU may be embodied as a standalone circuit or circuit package, integrated within an SOC, or integrated with networking circuitry (e.g., in a SmartNIC, or enhanced SmartNIC), acceleration circuitry, storage devices, storage disks, or AI hardware (e.g., GPUs, programmed FPGAs, or ASICs tailored to implement an AI model such as a neural network). Such an xPU may be designed to receive, retrieve, or otherwise obtain programming to process one or more data streams and perform specific tasks and actions for the data streams (such as hosting microservices, performing service management or orchestration, organizing or managing server or data center hardware, managing service meshes, or collecting and distributing telemetry), outside of the CPU or general purpose processing hardware. However, it will be understood that an xPU, an SOC, a CPU, and other variations of the processor 704 may work in coordination with each other to execute many types of operations and instructions within and on behalf of the compute node 700.

The memory 706 may be embodied as any type of volatile (e.g., dynamic random access memory (DRAM), etc.) or non-volatile memory or data storage capable of performing the functions described herein. Volatile memory may be a storage medium that requires power to maintain the state of data stored by the medium. Non-limiting examples of volatile memory may include various types of random access memory (RAM), such as DRAM or static random access memory (SRAM). One particular type of DRAM that may be used in a memory module is synchronous dynamic random access memory (SDRAM).

In an example, the memory device (e.g., memory circuitry) is any number of block addressable memory devices, such as those based on NAND or NOR technologies (for example, Single-Level Cell ("SLC"), Multi-Level Cell ("MLC"), Quad-Level Cell ("QLC"), Tri-Level Cell ("TLC"), or some other NAND). In some examples, the memory device(s) includes a byte-addressable write-in-place three dimensional crosspoint memory device, or other byte addressable write-in-place non-volatile memory (NVM) devices, such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric transistor random access memory (FeTRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, a combination of any of the above, or other suitable memory. A memory device may also include a three-dimensional crosspoint memory device (e.g., Intel® 3D XPoint™ memory), or other byte addressable write-in-place nonvolatile memory devices. The memory device may refer to the die itself or to a packaged memory product. In some examples, 3D crosspoint memory (e.g., Intel® 3D XPoint™ memory) may include a transistor-less stackable cross point architecture in which memory cells sit at the intersection of word lines and bit lines and are individually addressable and in which bit storage is based on a change in bulk resistance. In some examples, all or a portion of the memory 706 may be integrated into the processor 704. The memory 706 may store various software and data used during operation such as one or more applications, data operated on by the application(s), libraries, and drivers.

In some examples, resistor-based or transistor-less memory architectures include nanometer scale phase-change memory (PCM) devices in which a volume of phase-change material resides between at least two electrodes. Portions of the example phase-change material exhibit varying degrees of crystalline phases and amorphous phases, in which varying degrees of resistance between the at least two electrodes can be measured. In some examples, the phase-change material is a chalcogenide-based glass material. Such resistive memory devices are sometimes referred to as memristive devices that remember the history of the current that previously flowed through them. Stored data is retrieved from example PCM devices by measuring the electrical resistance, in which the crystalline phases exhibit a relatively lower resistance value(s) (e.g., logical "0") when compared to the amorphous phases having a relatively higher resistance value(s) (e.g., logical "1").

Example PCM devices store data for long periods of time (e.g., approximately 10 years at room temperature). Write operations to example PCM devices (e.g., set to logical "0", set to logical "1", set to an intermediary resistance value) are accomplished by applying one or more current pulses to the at least two electrodes, in which the pulses have a particular current magnitude and duration. For instance, a long low current pulse (SET) applied to the at least two electrodes causes the example PCM device to reside in a low-resistance crystalline state, while a comparatively short high current pulse (RESET) applied to the at least two electrodes causes the example PCM device to reside in a high-resistance amorphous state.

In some examples, implementation of PCM devices facilitates non-von Neumann computing architectures that enable in-memory computing capabilities. Generally speaking, traditional computing architectures include a central processing unit (CPU) communicatively connected to one or more memory devices via a bus. As such, a finite amount of energy and time is consumed to transfer data between the CPU and memory, which is a known bottleneck of von Neumann computing architectures. However, PCM devices minimize and, in some cases, eliminate data transfers between the CPU and memory by performing some computing operations in-memory. Stated differently, PCM devices both store information and execute computational tasks. Such non-von Neumann computing architectures may implement vectors having a relatively high dimensionality to facilitate hyperdimensional computing, such as vectors having 10,000 bits. Relatively large bit width vectors enable computing paradigms modeled after the human brain, which also processes information analogous to wide bit vectors.

The compute circuitry 702 is communicatively coupled to other components of the compute node 700 via the I/O subsystem 708, which may be embodied as circuitry or components to facilitate input/output operations with the compute circuitry 702 (e.g., with the processor 704 or the main memory 706) and other components of the compute circuitry 702. For example, the I/O subsystem 708 may be embodied as, or otherwise include, memory controller hubs, input/output control hubs, integrated sensor hubs, firmware devices, communication links (e.g., point-to-point links, bus links, wires, cables, light guides, printed circuit board traces, etc.), or other components and subsystems to facilitate the input/output operations. In some examples, the I/O subsystem 708 may form a portion of a system-on-a-chip (SoC) and be incorporated, along with one or more of the processor 704, the memory 706, and other components of the compute circuitry 702, into the compute circuitry 702.

The one or more illustrative data storage devices/disks 710 may be embodied as one or more of any type(s) of physical device(s) configured for short-term or long-term storage of data such as, for example, memory devices, memory, circuitry, memory cards, flash memory, hard disk drives (HDDs), solid-state drives (SSDs), or other data storage devices/disks. Individual data storage devices/disks 710 may include a system partition that stores data and firmware code for the data storage device/disk 710. Individual data storage devices/disks 710 may also include one or more operating system partitions that store data files and executables for operating systems depending on, for example, the type of compute node 700.

The communication circuitry 712 may be embodied as any communication circuit, device, or collection thereof, capable of enabling communications over a network between the compute circuitry 702 and another compute device (e.g., an Edge gateway of an implementing Edge computing system). The communication circuitry 712 may be configured to use any one or more communication technology (e.g., wired or wireless communications) and associated protocols (e.g., a cellular networking protocol such a 3GPP 4G or 5G standard, a wireless local area network protocol such as IEEE 802.11/Wi-Fi®, a wireless wide area network protocol, Ethernet, Bluetooth®, Bluetooth Low Energy, a IoT protocol such as IEEE 802.15.4 or ZigBee®, low-power wide-area network (LPWAN) or low-power wide-area (LPWA) protocols, etc.) to effect such communication.

The illustrative communication circuitry 712 includes a network interface controller (NIC) 720, which may also be referred to as a host fabric interface (HFI). The NIC 720 may be embodied as one or more add-in-boards, daughter cards, network interface cards, controller chips, chipsets, or other devices that may be used by the compute node 700 to connect with another compute device (e.g., an Edge gateway node). In some examples, the NIC 720 may be embodied as part of a system-on-a-chip (SoC) that includes one or more processors, or included on a multichip package that also contains one or more processors. In some examples, the NIC 720 may include a local processor (not shown) or a local memory (not shown) that are both local to the NIC 720. In such examples, the local processor of the NIC 720 may be capable of performing one or more of the functions of the compute circuitry 702 described herein. Additionally, or alternatively, in such examples, the local memory of the NIC 720 may be integrated into one or more components of the client compute node at the board level, socket level, chip level, or other levels.

Additionally, in some examples, a respective compute node 700 may include one or more peripheral devices 714. Such peripheral devices 714 may include any type of peripheral device found in a compute device or server such as audio input devices, a display, other input/output devices, interface devices, or other peripheral devices, depending on the particular type of the compute node 700. In further examples, the compute node 700 may be embodied by a respective Edge compute node (whether a client, gateway, or aggregation node) in an Edge computing system or like forms of appliances, computers, subsystems, circuitry, or other components.

Figure 7B:
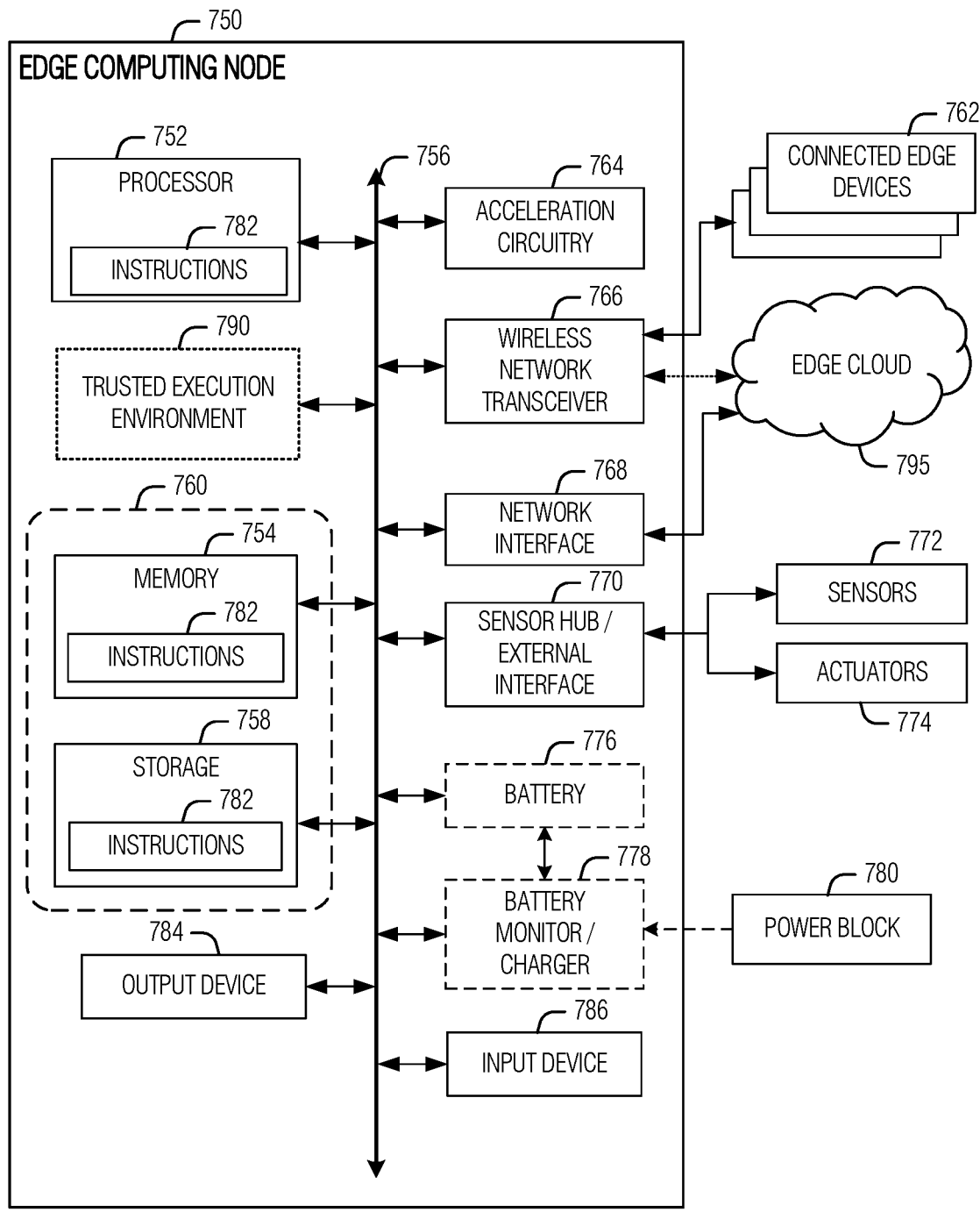
FIG. 7B provides a further overview of example components within a compute device in an Edge computing system.

In a more detailed example, FIG. 7B illustrates a block diagram of an example of components that may be present in an Edge computing node 750 for implementing the techniques (e.g., operations, processes, methods, and methodologies) described herein. This Edge computing node 750 provides a closer view of the respective components of node 700 when implemented as or as part of a compute device (e.g., as a mobile device, a base station, server, gateway, etc.). The Edge computing node 750 may include any combination of the hardware or logical components referenced herein, and it may include or couple with any device usable with an Edge communication network or a combination of such networks. The components may be implemented as integrated circuits (ICs), portions thereof, discrete electronic devices, or other modules, instruction sets, programmable logic or algorithms, hardware, hardware accelerators, software, firmware, or a combination thereof adapted in the Edge computing node 750, or as components otherwise incorporated within a chassis of a larger system.

The Edge compute device 750 may include processing circuitry in the form of a processor 752, which may be a microprocessor, a multi-core processor, a multithreaded processor, an ultra-low voltage processor, an embedded processor, an xPU/DPU/IPU/NPU, special purpose processing unit, specialized processing unit, or other known processing elements. The processor 752 may be a part of a system on a chip (SoC) in which the processor 752 and other components are formed into a single integrated circuit, or a single package, such as the Edison™ or Galileo™ SoC boards from Intel Corporation, Santa Clara, California As an example, the processor 752 may include an Intel® Architecture Core™ based CPU processor, such as a Quark™, an Atom™, an i3, an i5, an i7, an i9, or an MCU-class processor, or another such processor available from Intel®. However, any number other processors may be used, such as available from Advanced Micro Devices, Inc. (AMD®) of Sunnyvale, California, a MIPS®-based design from MIPS Technologies, Inc. of Sunnyvale, California, an ARM®-based design licensed from ARM Holdings, Ltd. or a customer thereof, or their licensees or adopters. The processors may include units such as an A5-A13 processor from Apple® Inc., a Snapdragon™ processor from Qualcomm® Technologies, Inc., or an OMAP™ processor from Texas Instruments, Inc. The processor 752 and accompanying circuitry may be provided in a single socket form factor, multiple socket form factor, or a variety of other formats, including in limited hardware configurations or configurations that include fewer than all elements shown in FIG. 7B.

The processor 752 may communicate with a system memory 754 over an interconnect 756 (e.g., a bus). Any number of memory devices may be used to provide for a given amount of system memory. As examples, the memory 754 may be random access memory (RAM) in accordance with a Joint Electron Devices Engineering Council (JEDEC) design such as the DDR or mobile DDR standards (e.g., LPDDR, LPDDR2, LPDDR3, or LPDDR4). In particular examples, a memory component may comply with a DRAM standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces. In various implementations, the individual memory devices may be of any number of different package types such as single die package (SDP), dual die package (DDP) or quad die package (Q17P). These devices, in some examples, may be directly soldered onto a motherboard to provide a lower profile solution, while in other examples the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs.

To provide for persistent storage of information such as data, applications, operating systems and so forth, a storage 758 may also couple to the processor 752 via the interconnect 756. In an example, the storage 758 may be implemented via a solid-state disk drive (SSDD). Other devices that may be used for the storage 758 include flash memory cards, such as Secure Digital (SD) cards, microSD cards, eXtreme Digital (XD) picture cards, and the like, and Universal Serial Bus (USB) flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

In low power implementations, the storage 758 may be on-die memory or registers associated with the processor 752. However, in some examples, the storage 758 may be implemented using a micro hard disk drive (HDD). Further, any number of new technologies may be used for the storage 758 in addition to, or instead of, the technologies described, such resistance change memories, phase change memories, holographic memories, or chemical memories, among others.

The components may communicate over the interconnect 756. The interconnect 756 may include any number of technologies, including industry standard architecture (ISA), extended ISA (EISA), peripheral component interconnect (PCI), peripheral component interconnect extended (PCIx), PCI express (PCIe), or any number of other technologies. The interconnect 756 may be a proprietary bus, for example, used in an SoC based system. Other bus systems may be included, such as an Inter-Integrated Circuit (I2C) interface, a Serial Peripheral Interface (SPI) interface, point to point interfaces, and a power bus, among others.

The interconnect 756 may couple the processor 752 to a transceiver 766, for communications with the connected Edge devices 762. The transceiver 766 may use any number of frequencies and protocols, such as 2.4 Gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the connected Edge devices 762. For example, a wireless local area network (WLAN) unit may be used to implement Wi-Fi® communications in accordance with the Institute of Electrical and Electronics Engineers (IEEE) 802.11 standard. In addition, wireless wide area communications, e.g., according to a cellular or other wireless wide area protocol, may occur via a wireless wide area network (WWAN) unit.

The wireless network transceiver 766 (or multiple transceivers) may communicate using multiple standards or radios for communications at a different range. For example, the Edge computing node 750 may communicate with close devices, e.g., within about 10 meters, using a local transceiver based on Bluetooth Low Energy (BLE), or another low power radio, to save power. More distant connected Edge devices 762, e.g., within about 50 meters, may be reached over ZigBee® or other intermediate power radios. Both communications techniques may take place over a single radio at different power levels or may take place over separate transceivers, for example, a local transceiver using BLE and a separate mesh transceiver using ZigBee®.

A wireless network transceiver 766 (e.g., a radio transceiver) may be included to communicate with devices or services in a cloud (e.g., an Edge cloud 795) via local or wide area network protocols. The wireless network transceiver 766 may be a low-power wide-area (LPWA) transceiver that follows the IEEE 802.15.4, or IEEE 802.15.4g standards, among others. The Edge computing node 750 may communicate over a wide area using LoRaWAN™ (Long Range Wide Area Network) developed by Semtech and the LoRa Alliance. The techniques described herein are not limited to these technologies but may be used with any number of other cloud transceivers that implement long range, low bandwidth communications, such as Sigfox, and other technologies. Further, other communications techniques, such as time-slotted channel hopping, described in the IEEE 802.15.4e specification may be used.

Any number of other radio communications and protocols may be used in addition to the systems mentioned for the wireless network transceiver 766, as described herein. For example, the transceiver 766 may include a cellular transceiver that uses spread spectrum (SPA/SAS) communications for implementing high-speed communications. Further, any number of other protocols may be used, such as Wi-Fi® networks for medium speed communications and provision of network communications. The transceiver 766 may include radios that are compatible with any number of 3GPP (Third Generation Partnership Project) specifications, such as Long Term Evolution (LTE) and 5th Generation (5G) communication systems, discussed in further detail at the end of the present disclosure. A network interface controller (NIC) 768 may be included to provide a wired communication to nodes of the Edge cloud 795 or to other devices, such as the connected Edge devices 762 (e.g., operating in a mesh). The wired communication may provide an Ethernet connection or may be based on other types of networks, such as Controller Area Network (CAN), Local Interconnect Network (LIN), DeviceNet, ControlNet, Data Highway+, PROFIBUS, or PROFINET, among many others. An additional NIC 768 may be included to enable connecting to a second network, for example, a first NIC 768 providing communications to the cloud over Ethernet, and a second NIC 768 providing communications to other devices over another type of network.

Given the variety of types of applicable communications from the device to another component or network, applicable communications circuitry used by the device may include or be embodied by any one or more of components 764, 766, 768, or 770. Accordingly, in various examples, applicable means for communicating (e.g., receiving, transmitting, etc.) may be embodied by such communications circuitry.

The Edge computing node 750 may include or be coupled to acceleration circuitry 764, which may be embodied by one or more artificial intelligence (AI) accelerators, a neural compute stick, neuromorphic hardware, an FPGA, an arrangement of GPUs, an arrangement of xPUs/DPUs/IPU/NPUs, one or more SoCs, one or more CPUs, one or more digital signal processors, dedicated ASICs, or other forms of specialized processors or circuitry designed to accomplish one or more specialized tasks. These tasks may include AI processing (including machine learning, training, inferencing, and classification operations), visual data processing, network data processing, object detection, rule analysis, or the like. These tasks also may include the specific Edge computing tasks for service management and service operations discussed elsewhere in this document.

The interconnect 756 may couple the processor 752 to a sensor hub or external interface 770 that is used to connect additional devices or subsystems. The devices may include sensors 772, such as accelerometers, level sensors, flow sensors, optical light sensors, camera sensors, temperature sensors, global navigation system (e.g., GPS) sensors, pressure sensors, barometric pressure sensors, and the like. The hub or interface 770 further may be used to connect the Edge computing node 750 to actuators 774, such as power switches, valve actuators, an audible sound generator, a visual warning device, and the like.

In some optional examples, various input/output (I/O) devices may be present within or connected to, the Edge computing node 750. For example, a display or other output device 784 may be included to show information, such as sensor readings or actuator position. An input device 786, such as a touch screen or keypad may be included to accept input. An output device 784 may include any number of forms of audio or visual display, including simple visual outputs such as binary status indicators (e.g., light-emitting diodes (LEDs)) and multi-character visual outputs, or more complex outputs such as display screens (e.g., liquid crystal display (LCD) screens), with the output of characters, graphics, multimedia objects, and the like being generated or produced from the operation of the Edge computing node 750. A display or console hardware, in the context of the present system, may be used to provide output and receive input of an Edge computing system; to manage components or services of an Edge computing system; identify a state of an Edge computing component or service; or to conduct any other number of management or administration functions or service use cases.

A battery 776 may power the Edge computing node 750, although, in examples in which the Edge computing node 750 is mounted in a fixed location, it may have a power supply coupled to an electrical grid, or the battery may be used as a backup or for temporary capabilities. The battery 776 may be a lithium ion battery, or a metal-air battery, such as a zinc-air battery, an aluminum-air battery, a lithium-air battery, and the like.

A battery monitor/charger 778 may be included in the Edge computing node 750 to track the state of charge (SoCh) of the battery 776, if included. The battery monitor/charger 778 may be used to monitor other parameters of the battery 776 to provide failure predictions, such as the state of health (SoH) and the state of function (SoF) of the battery 776. The battery monitor/charger 778 may include a battery monitoring integrated circuit, such as an LTC4020 or an LTC2990 from Linear Technologies, an ADT7488A from ON Semiconductor of Phoenix Arizona, or an IC from the UCD90xxx family from Texas Instruments of Dallas, TX The battery monitor/charger 778 may communicate the information on the battery 776 to the processor 752 over the interconnect 756. The battery monitor/charger 778 may also include an analog-to-digital (ADC) converter that enables the processor 752 to directly monitor the voltage of the battery 776 or the current flow from the battery 776. The battery parameters may be used to determine actions that the Edge computing node 750 may perform, such as transmission frequency, mesh network operation, sensing frequency, and the like.

A power block 780, or other power supply coupled to a grid, may be coupled with the battery monitor/charger 778 to charge the battery 776. In some examples, the power block 780 may be replaced with a wireless power receiver to obtain the power wirelessly, for example, through a loop antenna in the Edge computing node 750. A wireless battery charging circuit, such as an LTC4020 chip from Linear Technologies of Milpitas, California, among others, may be included in the battery monitor/charger 778. The specific charging circuits may be selected based on the size of the battery 776, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

The storage 758 may include instructions 782 in the form of software, firmware, or hardware commands to implement the techniques described herein. Although such instructions 782 are shown as code blocks included in the memory 754 and the storage 758, it may be understood that any of the code blocks may be replaced with hardwired circuits, for example, built into an application specific integrated circuit (ASIC).

In an example, the instructions 782 provided via the memory 754, the storage 758, or the processor 752 may be embodied as a non-transitory, machine-readable medium 760 including code to direct the processor 752 to perform electronic operations in the Edge computing node 750. The processor 752 may access the non-transitory, machine-readable medium 760 over the interconnect 756. For instance, the non-transitory, machine-readable medium 760 may be embodied by devices described for the storage 758 or may include specific storage units such as storage devices or storage disks that include optical disks (e.g., digital versatile disk (DVD), compact disk (CD), CD-ROM, Blu-ray disk), flash drives, floppy disks, hard drives (e.g., SSDs), or any number of other hardware devices in which information is stored for any duration (e.g., for extended time periods, permanently, for brief instances, for temporarily buffering, or caching). The non-transitory, machine-readable medium 760 may include instructions to direct the processor 752 to perform a specific sequence or flow of actions, for example, as described with respect to the flowchart(s) and block diagram(s) of operations and functionality depicted above. As used herein, the terms "machine-readable medium" and "computer-readable medium" are interchangeable. As used herein, the term "non-transitory computer-readable medium" is expressly defined to include any type of computer readable storage device or storage disk and to exclude propagating signals and to exclude transmission media.

Also in a specific example, the instructions 782 on the processor 752 (separately, or in combination with the instructions 782 of the machine readable medium 760) may configure execution or operation of a trusted execution environment (TEE) 790. In an example, the TEE 790 operates as a protected area accessible to the processor 752 for secure execution of instructions and secure access to data. Various implementations of the TEE 790, and an accompanying secure area in the processor 752 or the memory 754 may be provided, for instance, through use of Intel® Software Guard Extensions (SGX) or ARM® TrustZone® hardware security extensions, Intel® Management Engine (ME), or Intel® Converged Security Manageability Engine (CSME). Other aspects of security hardening, hardware roots-of-trust, and trusted or protected operations may be implemented in the device 750 through the TEE 790 and the processor 752.

While the illustrated examples of FIG. 7A and FIG. 7B include example components for a compute node and a compute device, respectively, examples disclosed herein are not limited thereto. As used herein, a "computer" may include some or all of the example components of FIG. 7A or 7B in different types of computing environments. Example computing environments include Edge compute devices (e.g., Edge computers) in a distributed networking arrangement such that particular ones of participating Edge compute devices are heterogenous or homogeneous devices. As used herein, a "computer" may include a personal computer, a server, user equipment, an accelerator, etc., including any combinations thereof. In some examples, distributed networking or distributed computing includes any number of such Edge compute devices as illustrated in FIG. 7A or 7B, each of which may include different subcomponents, different memory capacities, I/O capabilities, etc. For example, because some implementations of distributed networking or distributed computing are associated with particular desired functionality, examples disclosed herein include different combinations of components illustrated in FIG. 7A or 7B to satisfy functional objectives of distributed computing tasks. In some examples, the term "compute node" or "computer" only includes the example processor 704, memory 706 and I/O subsystem 708 of FIG. 7A. In some examples, one or more objective functions of a distributed computing task(s) rely on one or more alternate devices/structure located in different parts of an Edge networking environment, such as devices to accommodate data storage (e.g., the example data storage 710), input/output capabilities (e.g., the example peripheral device(s) 714), or network communication capabilities (e.g., the example NIC 720).

In some examples, computers operating in a distributed computing or distributed networking environment (e.g., an Edge network) are structured to accommodate particular objective functionality in a manner that reduces computational waste. For instance, because a computer includes a subset of the components disclosed in FIGS. 7A and 7B, such computers satisfy execution of distributed computing objective functions without including computing structure that would otherwise be unused or underutilized. As such, the term "computer" as used herein includes any combination of structure of FIG. 7A or 7B that is capable of satisfying or otherwise executing objective functions of distributed computing tasks. In some examples, computers are structured in a manner commensurate to corresponding distributed computing objective functions in a manner that downscales or upscales in connection with dynamic demand. In some examples, different computers are invoked or otherwise instantiated in view of their ability to process one or more tasks of the distributed computing request(s), such that any computer capable of satisfying the tasks proceed with such computing activity.

In the illustrated examples of FIGS. 7A and 7B, compute devices include operating systems. As used herein, an "operating system" is software to control example compute devices, such as the example Edge compute node 700 of FIG. 7A or the example Edge compute node 750 of FIG. 7B. Example operating systems include, but are not limited to consumer-based operating systems (e.g., Microsoft® Windows® 10, Google® Android® OS, Apple® Mac® OS, etc.). Example operating systems also include, but are not limited to industry-focused operating systems, such as real-time operating systems, hypervisors, etc. An example operating system on a first Edge compute node may be the same or different than an example operating system on a second Edge compute node. In some examples, the operating system invokes alternate software to facilitate one or more functions or operations that are not native to the operating system, such as particular communication protocols or interpreters. In some examples, the operating system instantiates various functionalities that are not native to the operating system. In some examples, operating systems include varying degrees of complexity or capabilities. For instance, a first operating system corresponding to a first Edge compute node includes a real-time operating system having particular performance expectations of responsivity to dynamic input conditions, and a second operating system corresponding to a second Edge compute node includes graphical user interface capabilities to facilitate end-user I/O.

Figure 8:
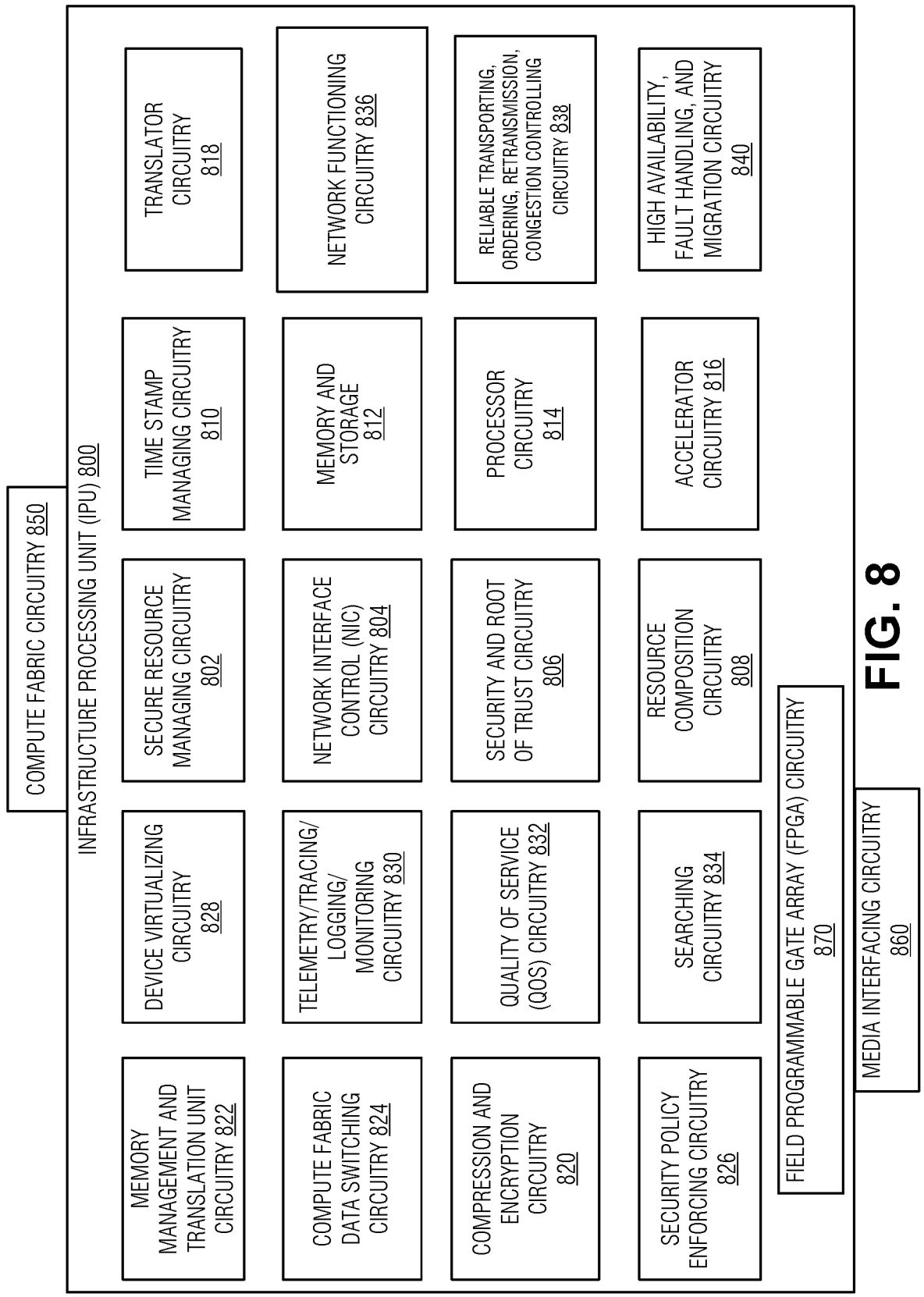
FIG. 8 is a schematic diagram of an example infrastructure processing unit (IPU).

FIG. 8 depicts an example of an infrastructure processing unit (IPU). Different examples of IPUs disclosed herein enable improved performance, management, security and coordination functions between entities (e.g., cloud service providers), and enable infrastructure offload or communications coordination functions. As disclosed in further detail below, IPUs may be integrated with smart NICs and storage or memory (e.g., on a same die, system on chip (SoC), or connected dies) that are located at on-premises systems, base stations, gateways, neighborhood central offices, and so forth. Different examples of one or more IPUs disclosed herein can perform an application including any number of microservices, where each microservice runs in its own process and communicates using protocols (e.g., an HTTP resource API, message service or gRPC). Microservices can be independently deployed using centralized management of these services. A management system may be written in different programming languages and use different data storage technologies.

Furthermore, one or more IPUs can execute platform management, networking stack processing operations, security (crypto) operations, storage software, identity and key management, telemetry, logging, monitoring and service mesh (e.g., control how different microservices communicate with one another). The IPU can access an xPU to offload performance of various tasks. For instance, an IPU exposes XPU, storage, memory, and CPU resources and capabilities as a service that can be accessed by other microservices for function composition. This can improve performance and reduce data movement and latency. An IPU can perform capabilities such as those of a router, load balancer, firewall, TCP/reliable transport, a service mesh (e.g., proxy or API gateway), security, data-transformation, authentication, quality of service (QoS), security, telemetry measurement, event logging, initiating and managing data flows, data placement, or job scheduling of resources on an xPU, storage, memory, or CPU.

In the illustrated example of FIG. 8, the IPU 800 includes or otherwise accesses secure resource managing circuitry 802, network interface controller (NIC) circuitry 804, security and root of trust circuitry 806, resource composition circuitry 808, time stamp managing circuitry 810, memory and storage 812, processing circuitry 814, accelerator circuitry 816, or translator circuitry 818. Any number or combination of other structure(s) can be used such as but not limited to compression and encryption circuitry 820, memory management and translation unit circuitry 822, compute fabric data switching circuitry 824, security policy enforcing circuitry 826, device virtualizing circuitry 828, telemetry, tracing, logging and monitoring circuitry 830, quality of service circuitry 832, searching circuitry 834, network functioning circuitry (e.g., routing, firewall, load balancing, network address translating (NAT), etc.) 836, reliable transporting, ordering, retransmission, congestion controlling circuitry 838, and high availability, fault handling and migration circuitry 840 shown in FIG. 8. Different examples can use one or more structures (components) of the example IPU 800 together or separately. For example, compression and encryption circuitry 820 can be used as a separate service or chained as part of a data flow with vSwitch and packet encryption.

In some examples, IPU 800 includes a field programmable gate array (FPGA) 870 structured to receive commands from an CPU, XPU, or application via an API and perform commands/tasks on behalf of the CPU, including workload management and offload or accelerator operations. The illustrated example of FIG. 8 may include any number of FPGAs configured or otherwise structured to perform any operations of any IPU described herein.

Example compute fabric circuitry 850 provides connectivity to a local host or device (e.g., server or device (e.g., xPU, memory, or storage device)). Connectivity with a local host or device or smartNIC or another IPU is, in some examples, provided using one or more of peripheral component interconnect express (PCIe), ARM AXI, Intel® QuickPath Interconnect (QPI), Intel® Ultra Path Interconnect (UPI), Intel® On-Chip System Fabric (IOSF), Omnipath, Ethernet, Compute Express Link (CXL), HyperTransport, NVLink, Advanced Microcontroller Bus Architecture (AMBA) interconnect, OpenCAPI, Gen-Z, CCIX, Infinity Fabric (IF), and so forth. Different examples of the host connectivity provide symmetric memory and caching to enable equal peering between CPU, XPU, and IPU (e.g., via CXL.cache and CXL.mem).

Example media interfacing circuitry 860 provides connectivity to a remote smartNIC or another IPU or service via a network medium or fabric. This can be provided over any type of network media (e.g., wired or wireless) and using any protocol (e.g., Ethernet, InfiniBand, Fiber channel, ATM, to name a few).

In some examples, instead of the server/CPU being the primary component managing IPU 800, IPU 800 is a root of a system (e.g., rack of servers or data center) and manages compute resources (e.g., CPU, xPU, storage, memory, other IPUs, and so forth) in the IPU 800 and outside of the IPU 800. Different operations of an IPU are described below.

In some examples, the IPU 800 performs orchestration to decide which hardware or software is to execute a workload based on available resources (e.g., services and devices) and considers service level agreements and latencies, to determine whether resources (e.g., CPU, xPU, storage, memory, etc.) are to be allocated from the local host or from a remote host or pooled resource. In examples when the IPU 800 is selected to perform a workload, secure resource managing circuitry 802 offloads work to a CPU, xPU, or other device and the IPU 800 accelerates connectivity of distributed runtimes, reduce latency, CPU and increases reliability.

In some examples, secure resource managing circuitry 802 runs a service mesh to decide what resource is to execute workload, and provide for L7 (application layer) and remote procedure call (RPC) traffic to bypass kernel altogether so that a user space application can communicate directly with the example IPU 800 (e.g., IPU 800 and application can share a memory space). In some examples, a service mesh is a configurable, low-latency infrastructure layer designed to handle communication among application microservices using application programming interfaces (APIs) (e.g., over remote procedure calls (RPCs)). The example service mesh provides fast, reliable, and secure communication among containerized or virtualized application infrastructure services. The service mesh can provide critical capabilities including, but not limited to service discovery, load balancing, encryption, observability, traceability, authentication and authorization, and support for the circuit breaker pattern.

In some examples, infrastructure services include a composite node created by an IPU at or after a workload from an application is received. In some cases, the composite node includes access to hardware devices, software using APIs, RPCs, gRPCs, or communications protocols with instructions such as, but not limited, to iSCSI, NVMe-oF, or CXL.

In some cases, the example IPU 800 dynamically selects itself to run a given workload (e.g., microservice) within a composable infrastructure including an IPU, xPU, CPU, storage, memory, and other devices in a node.

In some examples, communications transit through media interfacing circuitry 860 of the example IPU 800 through a NIC/smartNIC (for cross node communications) or loopback back to a local service on the same host. Communications through the example media interfacing circuitry 860 of the example IPU 800 to another IPU can then use shared memory support transport between xPUs switched through the local IPUs. Use of IPU-to-IPU communication can reduce latency and jitter through ingress scheduling of messages and work processing based on service level objective (SLO).

For example, for a request to a database application that requires a response, the example IPU 800 prioritizes its processing to minimize the stalling of the requesting application. In some examples, the IPU 800 schedules the prioritized message request issuing the event to execute a SQL query database and the example IPU constructs microservices that issue SQL queries and the queries are sent to the appropriate devices or services.

Figure 9:
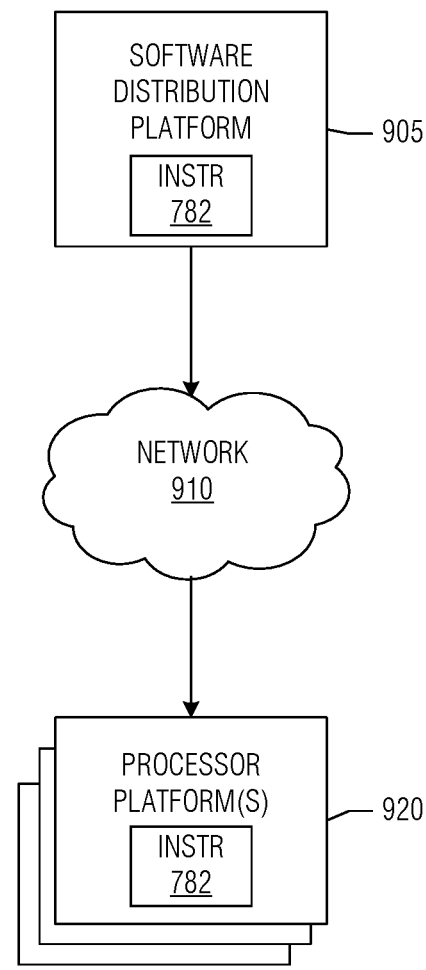
FIG. 9 illustrates an example software distribution platform to distribute software.

FIG. 9 illustrates an example software distribution platform 905 to distribute software, such as the example computer readable instructions 782 of FIG. 7, to one or more devices, such as example processor platform(s) 900 or connected edge devices. The example software distribution platform 905 may be implemented by any computer server, data facility, cloud service, etc., capable of storing and transmitting software to other compute devices (e.g., third parties). Example connected Edge devices may be customers, clients, managing devices (e.g., servers), third parties (e.g., customers of an entity owning or operating the software distribution platform 905). Example connected Edge devices may operate in commercial or home automation environments. In some examples, a third party is a developer, a seller, or a licensor of software such as the example computer readable instructions 782 of FIG. 7. The third parties may be consumers, users, retailers, OEMs, etc., that purchase or license the software for use or re-sale or sub-licensing. In some examples, distributed software causes display of one or more user interfaces (UIs) or graphical user interfaces (GUIs) to identify the one or more devices (e.g., connected Edge devices) geographically or logically separated from each other (e.g., physically separated IoT devices chartered with the responsibility of water distribution control (e.g., pumps), electricity distribution control (e.g., relays), etc.).

In the illustrated example of FIG. 9, the software distribution platform 905 includes one or more servers and one or more storage devices. The storage devices store the computer readable instructions 782, which may correspond to the example computer readable instructions described herein. The one or more servers of the example software distribution platform 905 are in communication with a network 910, which may correspond to any one or more of the Internet or any of the example networks described herein. In some examples, the one or more servers are responsive to requests to transmit the software to a requesting party as part of a commercial transaction. Payment for the delivery, sale, or license of the software may be handled by the one or more servers of the software distribution platform or via a third-party payment entity. The servers enable purchasers or licensors to download the computer readable instructions 782 from the software distribution platform 905. For example, the software, which may correspond to the example computer readable instructions discussed elsewhere herein, may be downloaded to the example processor platform(s) 920 (e.g., example connected Edge devices), which are to execute the computer readable instructions 782 to implement techniques described herein. In some examples, one or more servers of the software distribution platform 905 are communicatively connected to one or more security domains or security devices through which requests and transmissions of the example computer readable instructions 782 must pass. In some examples, one or more servers of the software distribution platform 905 periodically offer, transmit, or force updates to the software (e.g., the example computer readable instructions 782 of FIG. 7) to ensure improvements, patches, updates, etc., are distributed and applied to the software at the end user devices.

In the illustrated example of FIG. 9, the computer readable instructions 782 are stored on storage devices of the software distribution platform 905 in a particular format. A format of computer readable instructions includes, but is not limited to a particular code language (e.g., Java, JavaScript, Python, C, C#, SQL, HTML, etc.), or a particular code state (e.g., uncompiled code (e.g., ASCII), interpreted code, linked code, executable code (e.g., a binary), etc.). In some examples, the computer readable instructions 782 stored in the software distribution platform 905 are in a first format when transmitted to the example processor platform(s) 920. In some examples, the first format is an executable binary in which particular types of the processor platform(s) 920 can execute. However, in some examples, the first format is uncompiled code that requires one or more preparation tasks to transform the first format to a second format to enable execution on the example processor platform(s) 920. For instance, the receiving processor platform(s) 920 may need to compile the computer readable instructions 782 in the first format to generate executable code in a second format that is capable of being executed on the processor platform(s) 920. In still other examples, the first format is interpreted code that, upon reaching the processor platform(s) 920, is interpreted by an interpreter to facilitate execution of instructions.

Figure 10:
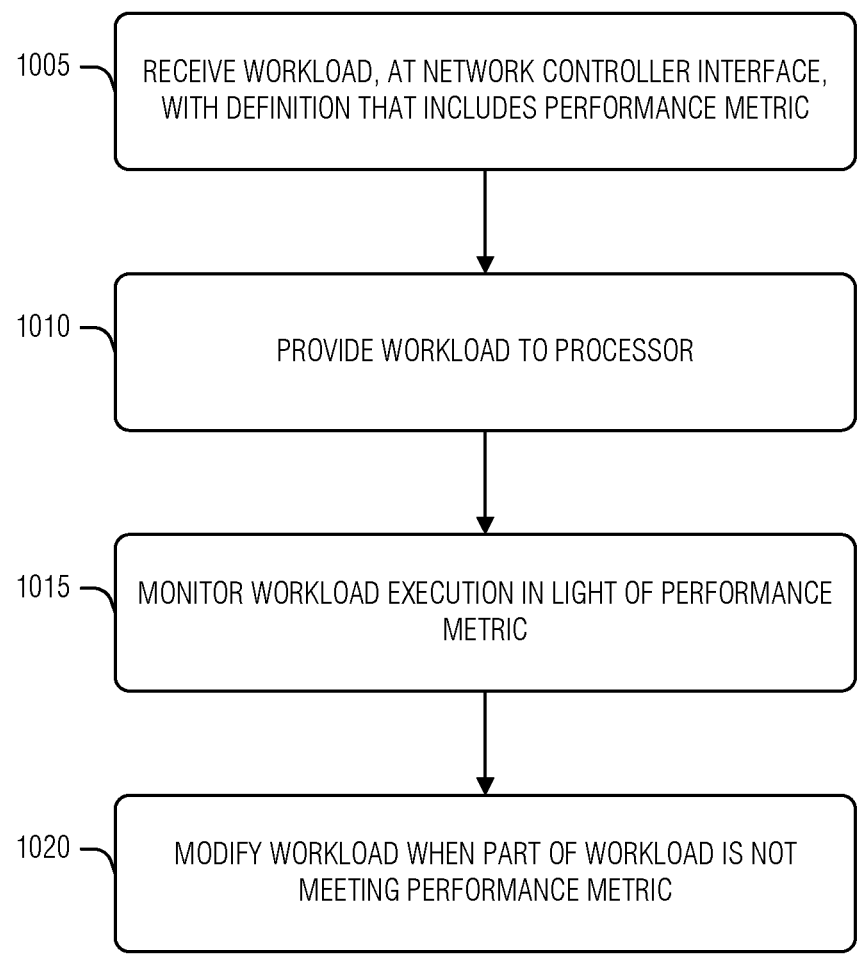
FIG. 10 illustrates a flow diagram of an example of a method for selectable clock source, according to an embodiment.

FIG. 10 illustrates a flow diagram of an example of a method 1000 for selectable clock source, according to an embodiment. The operations of the method 1000 are performed by computer hardware, such as that described above or below (e.g., processing circuitry).

At operation 1005, a mode detection device detects a first signal. In an example, the mode detection device is in a real-time clock (RTC) device. In an example, the first signal is a state of a reset line into the RTC.

At operation 1010, in response to detecting the first signal, a second signal is measured to detect a discrete position of the second signal. Here, the discrete position is one of multiple possible discrete positions of the second signal. Each of these multiple discrete positions correspond to different clock speed.

In an example, the second signal is a state of a test line into the RTC. In an example, the method 1000 includes the operation of setting resistance or capacitance on the test line to select which of the multiple discrete positions is the discrete position.

In an example, a first line of the multiple lines to the mode detection device originates from an oscillator included in the RTC. In an example, oscillator operates at a frequency of 32.768 kilohertz when the resonator is present.

In an example, a second line of the multiple lines to the mode detection device is a tap of an input signal line to a resonator for the oscillator. In an example, the method 1000 includes the operation of receiving the clock signal at the input line from a second oscillator external to the RTC. In an example, the resonator is absent. In an example, the clock signal has a frequency of four megahertz.

At operation 1015, an input line of multiple input lines to the mode detection device is selected based on the discrete position. This input line carries a clock signal of a clock frequency corresponding to the clock speed indicated by the discrete position of the second signal.

At operation 1020, the clock signal is normalized to a normalized clock signal.

At operation 1025, the normalized clock signal is output. In an example, the method 1000 includes the operation of outputting a clock mode signal. Here, the clock mode signal indicates the clock speed corresponding to the discrete position. In an example, the mode detection device outputs the clock mode signal to a power management component (PMC). In an example, the method 1000 includes the operation of selecting—by the PMC—a clock count based on the clock mode signal. In an example, the clock count is a clock tick threshold before starting other components of a device that includes the PMC.

Figure 11:
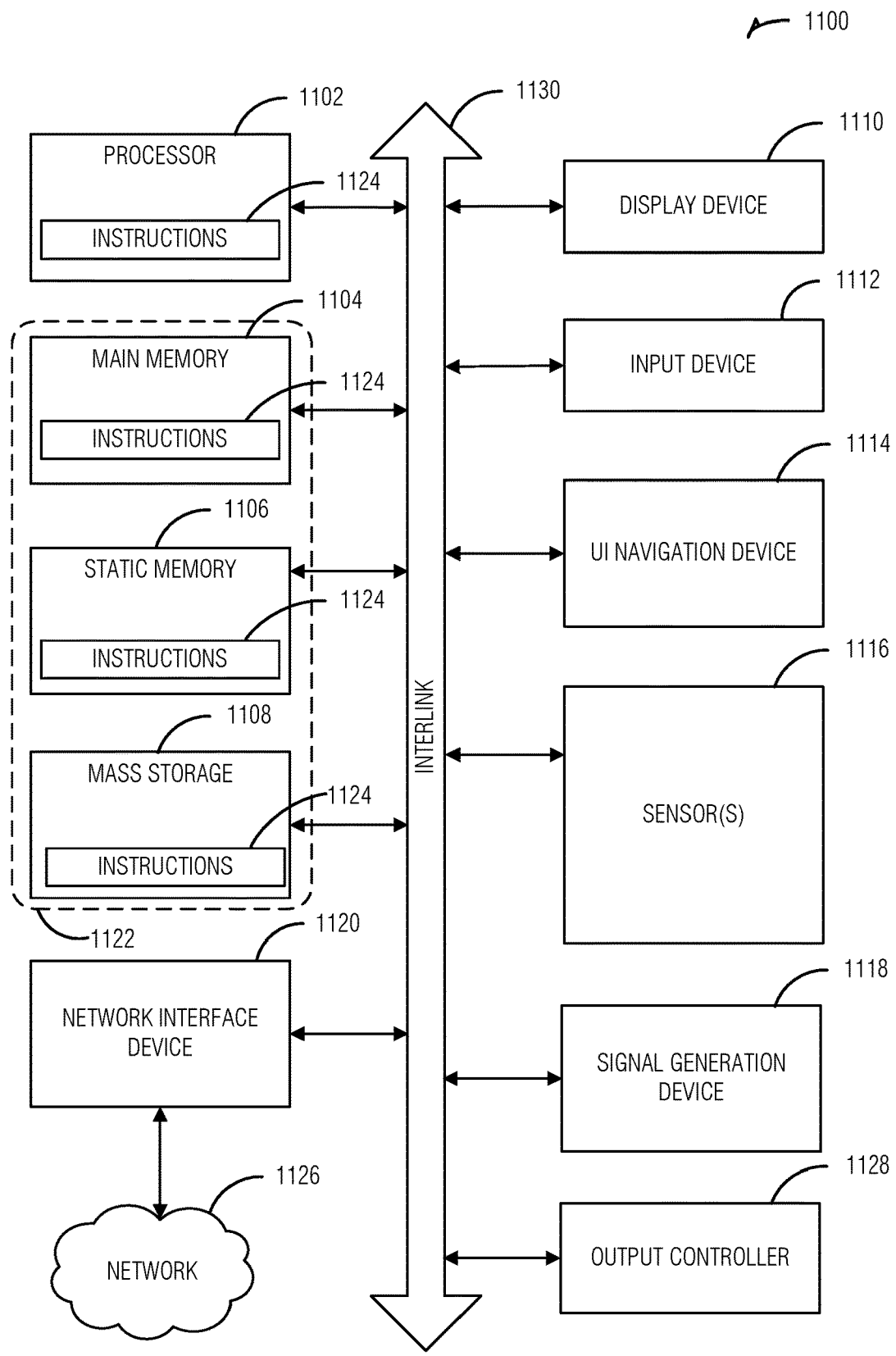
FIG. 11 is a block diagram illustrating an example of a machine upon which one or more embodiments may be implemented.

FIG. 11 illustrates a block diagram of an example machine 1100 upon which any one or more of the techniques (e.g., methodologies) discussed herein may perform. Examples, as described herein, may include, or may operate by, logic or a number of components, or mechanisms in the machine 1100. Circuitry (e.g., processing circuitry) is a collection of circuits implemented in tangible entities of the machine 1100 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1100 follow.

In alternative embodiments, the machine 1100 may operate as a standalone device or may be connected (e.g., networked) to other machines. In a networked deployment, the machine 1100 may operate in the capacity of a server machine, a client machine, or both in server-client network environments. In an example, the machine 1100 may act as a peer machine in peer-to-peer (P2P) (or other distributed) network environment. The machine 1100 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 1100 may include a hardware processor 1102 (e.g., a central processing unit (CPU), a graphics processing unit (GPU), a hardware processor core, or any combination thereof), a main memory 1104, a static memory (e.g., memory or storage for firmware, microcode, a basic-input-output (BIOS), unified extensible firmware interface (UEFI), etc.) 1106, and mass storage 1108 (e.g., hard drives, tape drives, flash storage, or other block devices) some or all of which may communicate with each other via an interlink (e.g., bus) 1130. The machine 1100 may further include a display unit 1110, an alphanumeric input device 1112 (e.g., a keyboard), and a user interface (UI) navigation device 1114 (e.g., a mouse). In an example, the display unit 1110, input device 1112 and UI navigation device 1114 may be a touch screen display. The machine 1100 may additionally include a storage device (e.g., drive unit) 1108, a signal generation device 1118 (e.g., a speaker), a network interface device 1120, and one or more sensors 1116, such as a global positioning system (GPS) sensor, compass, accelerometer, or other sensor. The machine 1100 may include an output controller 1128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1102, the main memory 1104, the static memory 1106, or the mass storage 1108 may be, or include, a machine readable medium 1122 on which is stored one or more sets of data structures or instructions 1124 (e.g., software) embodying or utilized by any one or more of the techniques or functions described herein. The instructions 1124 may also reside, completely or at least partially, within any of registers of the processor 1102, the main memory 1104, the static memory 1106, or the mass storage 1108 during execution thereof by the machine 1100. In an example, one or any combination of the hardware processor 1102, the main memory 1104, the static memory 1106, or the mass storage 1108 may constitute the machine readable media 1122. While the machine readable medium 1122 is illustrated as a single medium, the term "machine readable medium" may include a single medium or multiple media (e.g., a centralized or distributed database, or associated caches and servers) configured to store the one or more instructions 1124.

The term "machine readable medium" may include any medium that is capable of storing, encoding, or carrying instructions for execution by the machine 1100 and that cause the machine 1100 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1122 may be representative of the instructions 1124, such as instructions 1124 themselves or a format from which the instructions 1124 may be derived. This format from which the instructions 1124 may be derived may include source code, encoded instructions (e.g., in compressed or encrypted form), packaged instructions (e.g., split into multiple packages), or the like. The information representative of the instructions 1124 in the machine readable medium 1122 may be processed by processing circuitry into the instructions to implement any of the operations discussed herein. For example, deriving the instructions 1124 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1124.

In an example, the derivation of the instructions 1124 may include assembly, compilation, or interpretation of the information (e.g., by the processing circuitry) to create the instructions 1124 from some intermediate or preprocessed format provided by the machine readable medium 1122. The information, when provided in multiple parts, may be combined, unpacked, and modified to create the instructions 1124. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1124 may be further transmitted or received over a communications network 1126 using a transmission medium via the network interface device 1120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 1120 may include one or more physical jacks (e.g., Ethernet, coaxial, or phone jacks) or one or more antennas to connect to the communications network 1126. In an example, the network interface device 1120 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1100, and includes digital or analog communications signals or other intangible medium to facilitate communication of such software. A transmission medium is a machine readable medium.

Additional Notes & Examples

Example 1 is a real-time clock (RTC) device for providing a selectable clock source, the RTC device comprising: a first input signal line; a second input signal line; an output signal line; and a mode detection device with multiple input lines, the mode detection device configured to: detect, on the first input signal line, a first signal; measure, in response to the detection of the first signal, a second signal on the second signal input line to detect a discrete position of the second signal, the discrete position being one of multiple discrete positions of the second signal, each of the multiple discrete positions corresponding to different clock speed; select an input line of the multiple input lines based on the discrete position, the input line carrying a clock signal of a clock frequency corresponding to the clock speed indicated by the discrete position of the second signal; normalize the clock signal to a normalized clock signal; and output, via the output signal line, the normalized clock signal.

In Example 2, the subject matter of Example 1 includes, a second output signal line, wherein the mode detection device is configured to output, via the second output signal line, a clock mode signal, the clock mode signal indicating the clock speed corresponding to the discrete position.

In Example 3, the subject matter of Example 2 includes, wherein the second output signal line connects the RTC device to a power management component (PMC).

In Example 4, the subject matter of Example 3 includes, wherein the RTC device is part of a system that includes the PMC, and wherein processing circuitry of the PMC is configured to a clock count based on the clock mode signal, wherein the clock count is a clock tick threshold before starting other components of a device that includes the PMC.

In Example 5, the subject matter of Examples 1-4 includes, wherein the first input signal line is a reset line, wherein the first input signal is a state of the reset line into the RTC device, wherein the second input signal line is a test line, and wherein the second signal is a state of the test line.

In Example 6, the subject matter of Example 5 includes, wherein the resistance or capacitance on the test line selects which of the multiple discrete positions is the discrete position.

In Example 7, the subject matter of Example undefined includes, an oscillator, wherein a first line of the multiple lines to the mode detection device originates from the oscillator, and wherein a second line of the multiple lines to the mode detection device is a tap of an input signal line to a resonator for the oscillator.

In Example 8, the subject matter of Example 7 includes, wherein the mode detection device is configured to receive the clock signal at the input signal line to the resonator, the clock signal being from a second oscillator external to the RTC.

In Example 9, the subject matter of Example 8 includes, wherein the resonator is absent.

In Example 10, the subject matter of Examples 8-9 includes, wherein the clock frequency of the clock signal is four megahertz.

In Example 11, the subject matter of Example 10 includes, wherein the oscillator, when the resonator is present, produces the clock signal with the clock frequency at 32.768 kilohertz.

Example 12 is a method for providing a selectable clock source, the method comprising: detecting, at a mode detection device, a first signal; measuring, in response to the detection of the first signal, a second signal to detect a discrete position of the second signal, the discrete position being one of multiple discrete positions of the second signal, each of the multiple discrete positions corresponding to different clock speed; selecting an input line of multiple input lines to the mode detection device based on the discrete position, the input line carrying a clock signal of a clock frequency corresponding to the clock speed indicated by the discrete position of the second signal; normalizing the clock signal to a normalized clock signal; and outputting the normalized clock signal.

In Example 13, the subject matter of Example 12 includes, outputting a clock mode signal, the clock mode signal indicating the clock speed corresponding to the discrete position.

In Example 14, the subject matter of Example 13 includes, wherein the mode detection device outputs the clock mode signal to a power management component (PMC).

In Example 15, the subject matter of Example 14 includes, selecting, by the PMC, a clock count based on the clock mode signal, wherein the clock count is a clock tick threshold before starting other components of a device that includes the PMC.

In Example 16, the subject matter of Examples 12-15 includes, wherein the mode detection device is in a real-time clock (RTC) device.

In Example 17, the subject matter of Example 16 includes, wherein the first signal is a state of a reset line into the RTC device, and the second signal is a state of a test line into the RTC device.

In Example 18, the subject matter of Example 17 includes, setting resistance or capacitance on the test line to select which of the multiple discrete positions is the discrete position.

In Example 19, the subject matter of Examples 16-18 includes, wherein a first line of the multiple lines to the mode detection device originates from an oscillator included in the RTC, and wherein a second line of the multiple lines to the mode detection device is a tap of an input signal line to a resonator for the oscillator.

In Example 20, the subject matter of Example 19 includes, receiving the clock signal at the input signal line, the clock signal being from a second oscillator external to the RTC.

In Example 21, the subject matter of Example 20 includes, wherein the resonator is absent.

In Example 22, the subject matter of Examples 20-21 includes, wherein the clock frequency of the clock signal is four megahertz.

In Example 23, the subject matter of Example 22 includes, wherein the oscillator, when the resonator is present, produces the clock signal with the clock frequency at 32.768 kilohertz.

Example 24 is a system for providing a selectable clock source, the system comprising: means for detecting, at a mode detection device, a first signal; means for measuring, in response to the detection of the first signal, a second signal to detect a discrete position of the second signal, the discrete position being one of multiple discrete positions of the second signal, each of the multiple discrete positions corresponding to different clock speed; means for selecting an input line of multiple input lines to the mode detection device based on the discrete position, the input line carrying a clock signal of a clock frequency corresponding to the clock speed indicated by the discrete position of the second signal; means for normalizing the clock signal to a normalized clock signal; and means for outputting the normalized clock signal.

In Example 25, the subject matter of Example 24 includes, means for outputting a clock mode signal, the clock mode signal indicating the clock speed corresponding to the discrete position.

In Example 26, the subject matter of Example 25 includes, wherein the mode detection device outputs the clock mode signal to a power management component (PMC).

In Example 27, the subject matter of Example 26 includes, means for selecting, by the PMC, a clock count based on the clock mode signal, wherein the clock count is a clock tick threshold before starting other components of a device that includes the PMC.

In Example 28, the subject matter of Examples 24-27 includes, wherein the mode detection device is in a real-time clock (RTC) device.

In Example 29, the subject matter of Example 28 includes, wherein the first signal is a state of a reset line into the RTC device, and the second signal is a state of a test line into the RTC device.

In Example 30, the subject matter of Example 29 includes, means for setting resistance or capacitance on the test line to select which of the multiple discrete positions is the discrete position.

In Example 31, the subject matter of Examples 28-30 includes, wherein a first line of the multiple lines to the mode detection device originates from an oscillator included in the RTC, and wherein a second line of the multiple lines to the mode detection device is a tap of an input signal line to a resonator for the oscillator.

In Example 32, the subject matter of Example 31 includes, means for receiving the clock signal at the input signal line, the clock signal being from a second oscillator external to the RTC.

In Example 33, the subject matter of Example 32 includes, wherein the resonator is absent.

In Example 34, the subject matter of Examples 32-33 includes, wherein the clock frequency of the clock signal is four megahertz.

In Example 35, the subject matter of Example 34 includes, wherein the oscillator, when the resonator is present, produces the clock signal with the clock frequency at 32.768 kilohertz.

Example 36 is at least one machine-readable medium including instructions that, when executed by processing circuitry, cause the processing circuitry to perform operations to implement of any of Examples 1-35.

Example 37 is an apparatus comprising means to implement of any of Examples 1-35.

Example 38 is a system to implement of any of Examples 1-35.

Example 39 is a method to implement of any of Examples 1-35.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the embodiments should be determined with reference to the appended claims, along with the full scope of equivalents to which such claims are entitled.

The invention claimed is:

1. A real-time clock (RTC) device for providing a selectable clock source, the RTC device comprising:
a first input signal line;
a second input signal line;
an output signal line; and
a mode detection device with multiple input lines, the mode detection device configured to:
detect, on the first input signal line, a first signal;
measure, in response to the detection of the first signal, a second signal on the second signal input line to detect a discrete position of the second signal, the discrete position being one of multiple discrete positions of the second signal, each of the multiple discrete positions corresponding to different clock speed;
select an input line of the multiple input lines based on the discrete position, the input line carrying a clock signal of a clock frequency corresponding to the clock speed indicated by the discrete position of the second signal;
normalize the clock signal to a normalized clock signal; and
output, via the output signal line, the normalized clock signal.

2. The RTC device of claim 1 comprising:
a second output signal line, wherein the mode detection device is configured to output, via the second output signal line, a clock mode signal, the clock mode signal indicating the clock speed corresponding to the discrete position.

3. The RTC device of claim 2, wherein the second output signal line connects the RTC device to a power management component (PMC).

4. The RTC device of claim 3, wherein the RTC device is part of a system that includes the PMC, and wherein processing circuitry of the PMC is configured to a clock count based on the clock mode signal, wherein the clock count is a clock tick threshold before starting other components of a device that includes the PMC.

5. The RTC device of claim 1, wherein the first input signal line is a reset line, wherein the first input signal is a state of the reset line into the RTC device, wherein the second input signal line is a test line, and wherein the second signal is a state of the test line.

6. The RTC device of claim 5, wherein the resistance or capacitance on the test line selects which of the multiple discrete positions is the discrete position.

7. The RTC device of claim 1 comprising an oscillator, wherein a first line of the multiple lines to the mode detection device originates from the oscillator, and wherein a second line of the multiple lines to the mode detection device is a tap of an input signal line to a resonator for the oscillator.

8. The RTC device of claim 7, wherein the mode detection device is configured to receive the clock signal at the input signal line to the resonator, the clock signal being from a second oscillator external to the RTC.

9. The RTC device of claim 8, wherein the resonator is absent.

10. The RTC device of claim 8, wherein the clock frequency of the clock signal is four megahertz.

11. The RTC device of claim 10, wherein the oscillator, when the resonator is present, produces the clock signal with the clock frequency at 32.768 kilohertz.

12. A method for providing a selectable clock source, the method comprising:
detecting, at a mode detection device, a first signal;
measuring, in response to the detection of the first signal, a second signal to detect a discrete position of the second signal, the discrete position being one of multiple discrete positions of the second signal, each of the multiple discrete positions corresponding to different clock speed;
selecting an input line of multiple input lines to the mode detection device based on the discrete position, the input line carrying a clock signal of a clock frequency corresponding to the clock speed indicated by the discrete position of the second signal;
normalizing the clock signal to a normalized clock signal; and
outputting the normalized clock signal.

13. The method of claim 12 comprising:
outputting a clock mode signal, the clock mode signal indicating the clock speed corresponding to the discrete position.

14. The method of claim 13, wherein the mode detection device outputs the clock mode signal to a power management component (PMC).

15. The method of claim 14 comprising:
selecting, by the PMC, a clock count based on the clock mode signal, wherein the clock count is a clock tick threshold before starting other components of a device that includes the PMC.

16. A system for providing a selectable clock source, the system comprising:
means for detecting, at a mode detection device, a first signal;
means for measuring, in response to the detection of the first signal, a second signal to detect a discrete position of the second signal, the discrete position being one of multiple discrete positions of the second signal, each of the multiple discrete positions corresponding to different clock speed;
means for selecting an input line of multiple input lines to the mode detection device based on the discrete position, the input line carrying a clock signal of a clock frequency corresponding to the clock speed indicated by the discrete position of the second signal;
means for normalizing the clock signal to a normalized clock signal; and
means for outputting the normalized clock signal.

17. The system of claim 16, wherein the mode detection device is in a real-time clock (RTC) device.

18. The system of claim 17, wherein the first signal is a state of a reset line into the RTC device, and the second signal is a state of a test line into the RTC device.

19. The system of claim 18 comprising:
means for setting resistance or capacitance on the test line to select which of the multiple discrete positions is the discrete position.

20. The system of claim 17, wherein a first line of the multiple lines to the mode detection device originates from an oscillator included in the RTC, and wherein a second line of the multiple lines to the mode detection device is a tap of an input signal line to a resonator for the oscillator.

21. The system of claim 20, comprising:
means for receiving the clock signal at the input signal line, the clock signal being from a second oscillator external to the RTC.

22. The system of claim 21, wherein the resonator is absent.

23. The system of claim 21, wherein the clock frequency of the clock signal is four megahertz.

24. The system of claim 23, wherein the oscillator, when the resonator is present, produces the clock signal with the clock frequency at 32.768 kilohertz.

* * * * *